(12) United States Patent
Khakpour et al.

(10) Patent No.: US 12,556,148 B2
(45) Date of Patent: Feb. 17, 2026

(54) HYBRID LOW POWER RAIL TO RAIL AMPLIFIER WITH LEAKAGE CONTROL

(71) Applicant: QUALCOMM Incorporated, San Diego, CA (US)

(72) Inventors: Armina Khakpour, San Diego, CA (US); Patrick Isakanian, El Dorado Hills, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 606 days.

(21) Appl. No.: 17/964,608

(22) Filed: Oct. 12, 2022

(65) Prior Publication Data

US 2024/0128941 A1    Apr. 18, 2024

(51) Int. Cl.
*H03F 3/45* (2006.01)
*H03F 1/02* (2006.01)
*H03F 3/72* (2006.01)

(52) U.S. Cl.
CPC ....... *H03F 3/45179* (2013.01); *H03F 1/0211* (2013.01); *H03F 3/72* (2013.01);
(Continued)

(58) Field of Classification Search
CPC .............. H03F 3/45179; H03F 1/0211; H03F 2200/504; H03F 2203/45002;
(Continued)

(56) References Cited

U.S. PATENT DOCUMENTS 4,798,982 A * 1/1989 Voorman ............... H04B 1/586
                                                    333/32
5,488,320 A    1/1996 Carvella et al.
(Continued)

FOREIGN PATENT DOCUMENTS

CN         1441547 A  *  9/2003 ........... G09G 3/2011
CN       105427575 A     3/2016
(Continued)

OTHER PUBLICATIONS

Partial International Search Report—PCT/US2023/073049—ISA/EPO—Dec. 1, 2023.
(Continued)

*Primary Examiner* — Andrea Lindgren Baltzell
*Assistant Examiner* — Lance Torbjorn Bartol
(74) *Attorney, Agent, or Firm* — Loza & Loza, LLP

(57) ABSTRACT

An amplifier includes first and second input transistors, a first current mirror, a second current mirror, and a third current mirror. An input terminal of the first current mirror is coupled to a drain of the first input transistor, an input terminal of the second current mirror is coupled to a drain of the second input transistor, and an input terminal of the third current mirror is coupled to an output terminal of the first current mirror. An output terminal of the first current mirror and an output terminal of the third current mirror are coupled to an output of the amplifier. The amplifier also includes third and fourth input transistors, wherein a drain of the third input transistor is coupled to the input terminal of the third current mirror, and a drain of the fourth input transistor is coupled to the output of the amplifier.

15 Claims, 17 Drawing Sheets

(52) U.S. Cl.
CPC .................. *H03F 2200/504* (2013.01); *H03F 2203/45002* (2013.01); *H03F 2203/45496* (2013.01); *H03F 2203/45498* (2013.01)

(58) Field of Classification Search
CPC . H03F 2203/45496; H03F 2203/45498; H03F 3/72
USPC ........................................................ 330/257
See application file for complete search history.

(56) References Cited

U.S. PATENT DOCUMENTS

| | | | |
|---|---|---|---|
| 8,289,077 B2 | 10/2012 | Bruin | |
| 2005/0162954 A1* | 7/2005 | Nishihara | G11C 29/50 |
| | | | 365/208 |
| 2006/0226877 A1* | 10/2006 | Nishimura | H03F 3/45345 |
| | | | 327/52 |
| 2010/0237945 A1* | 9/2010 | Cassia | H03F 3/211 |
| | | | 330/277 |
| 2023/0198476 A1* | 6/2023 | Hu | H03F 3/45085 |
| | | | 330/252 |

FOREIGN PATENT DOCUMENTS

| | | | | |
|---|---|---|---|---|
| CN | 106612112 A | | 5/2017 | |
| JP | H0268973 A | * | 3/1990 | |
| JP | 3103154 B2 | * | 10/2000 | ........... G11C 27/024 |
| JP | 5815433 B2 | | 11/2015 | |
| TW | 1326968 B | * | 7/2010 | ........... H03K 5/2481 |

OTHER PUBLICATIONS

International Search Report and Written Opinion—PCT/US2023/073049—ISA/EPO—Feb. 15, 2024.

* cited by examiner

HYBRID LOW POWER RAIL TO RAIL AMPLIFIER WITH LEAKAGE CONTROL

BACKGROUND

Field

Aspects of the present disclosure relate generally to amplifiers, and, more particularly, to hybrid amplifiers.

Background

A receiver may include one or more amplifiers for amplifying one or more signals received by the receiver. For example, in a memory system (e.g., double data rate (DDR) memory system), a receiver may include one or more amplifiers for amplifying one or more signals (e.g., data signal) received from a memory chip (e.g., DDR memory) or a memory controller.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes an amplifier. The amplifier includes a first input transistor, wherein a gate of the first input transistor is coupled to a first input of the amplifier, and a second input transistor, wherein a gate of the second input transistor is coupled to a second input of the amplifier. The amplifier also includes a first current mirror, wherein an input terminal of the first current mirror is coupled to a drain of the first input transistor, and a second current mirror, wherein an input terminal of the second current mirror is coupled to a drain of the second input transistor, and an output terminal of the second current mirror is coupled to an output of the amplifier. The amplifier also includes a third current mirror, wherein an input terminal of the third current mirror is coupled to an output terminal of the first current mirror, and an output terminal of the third current mirror is coupled to the output of the amplifier. The amplifier also includes a third input transistor, wherein a gate of the third input transistor is coupled to the first input of the amplifier, and a drain of the third input transistor is coupled to the input terminal of the third current mirror. The amplifier further includes a fourth input transistor, wherein a gate of the fourth input transistor is coupled to a second input of the amplifier, and a drain of the fourth input transistor is coupled to the output of the amplifier.

A second aspect relates to a method for amplifying a signal. The method includes driving first and second input transistors with the signal, multiplying a first current from the first input transistor using a first current mirror to obtain a multiplied first current, and multiplying a second current from the second input transistor using a second current mirror to obtain a multiplied second current. The method also includes driving third and fourth input transistors with the signal, combining a third current from the third input transistor and the multiplied first current to obtain a combination of the third current and the multiplied first current, and combining a fourth current from the fourth input transistor and the multiplied second current to obtain a combination of the fourth current and the multiplied second current.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
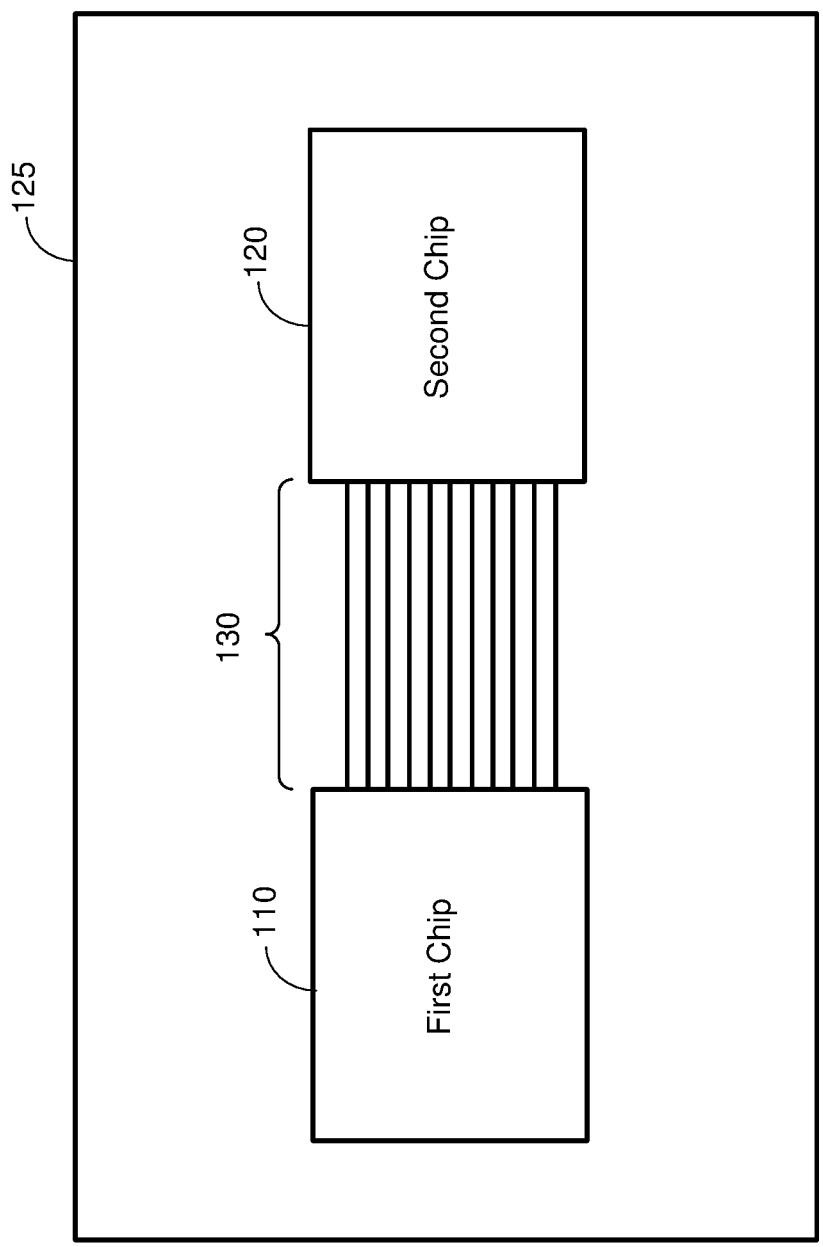
FIG. 1 shows an example of multiple chips according to certain aspects of the present disclosure.

FIG. 1 shows an example of a first chip 110 and a second chip 120 according to certain aspects. The first chip 110 and the second chip 120 may be mounted on a substrate 125 (e.g., a printed circuit board, a ceramic substrate, etc.). However, it is to be appreciated that the first chip 110 and the second chip 120 need not be mounted on a substrate in some implementations.

FIG. 1 also shows multiple links 130 (also referred to as channels) coupled between the first chip 110 and the second chip 120 to facilitate chip-to-chip (i.e., die-to-die) communication between the chips 110 and 120. The links 130 may include transmission lines (e.g., metal traces) on the substrate 125 and/or transmission lines embedded in the substrate 125. In this example, each of the chips 110 and 120 may include one or more transmitters (also referred to as drivers) for transmitting signals to the other one of the chips 110 and 120 via one or more of the links 130, and each of the chips 110 and 120 may include one or more receivers for receiving signals from the other one of the chips 110 and 120 via one or more of the links 130. Each of the receivers may include one or more amplifiers.

In one example, the first chip 110 may include one or more processors and a memory controller, and the second chip 120 may include a memory circuit (e.g., a double data rate (DDR) memory), or vice versa. In this example, the memory controller may be configured to provide the one or more processors with access to the memory circuit, as discussed further below. However, it is to be appreciated that the present disclosure is not limited to memory, and be applied to other applications.

Figure 2:
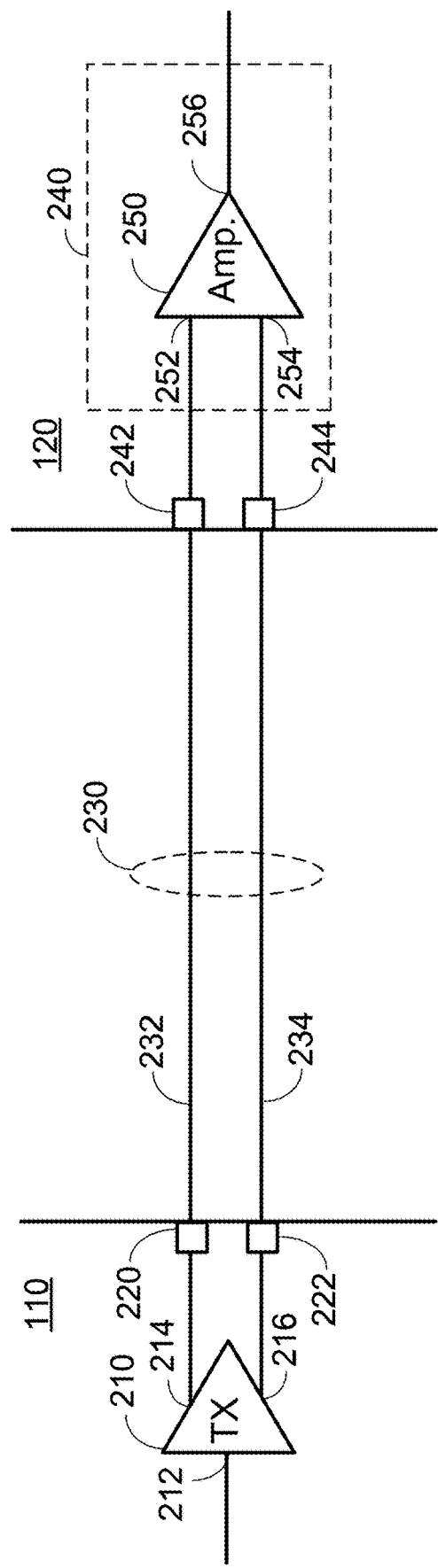
FIG. 2 shows an example of a transmitter, a receiver, and a link between the transmitter and the receiver according to certain aspects of the present disclosure.

FIG. 2 shows an example of chip-to-chip communication via a link 230 from among the multiple links 130 shown in FIG. 1. In this example, the first chip 110 includes a transmitter 210 (also referred to as a driver), a first pad 220 coupled to a first output 214 of the transmitter 210, and a second pad 222 coupled to a second output 216 of the transmitter 210. The second chip 120 includes a receiver 240, a first pad 242, and a second pad 244. The receiver 240 includes an amplifier 250, in which a first input 252 of the amplifier 250 is coupled to the first pad 242, and a second input 254 of the amplifier 250 is coupled to the second pad 244. The link 230 may be a differential link including a first transmission line 232 and a second transmission line 234. The first transmission line 232 is coupled between the first pad 220 of the first chip 110 and the first pad 242 of the second chip 120. The second transmission line 234 is coupled between the second pad 222 of the first chip 110 and the second pad 244 of the second chip 120.

In operation, the transmitter 210 receives a signal (e.g., a data signal) at the input 212 and transmits the signal to the second chip 120 via the link 230. In one example, the transmitter 210 may transmit the signal as a differential signal including a first signal and a second signal, in which the first signal is transmitted via the first transmission line 232 and the second signal is transmitted via the second transmission line 234. However, it is to be appreciated that the present disclosure is not limited to this example.

In one example, the first chip 110 includes a memory controller (e.g., DDR memory controller) and the transmitter 210 is included in a physical layer (PHY) (e.g., DDR PHY) or an I/O interface interfacing the memory controller with the second chip 120. In this example, the signal transmitted by the transmitter 210 may include data, addresses, and/or commands to be transmitted to a memory circuit (e.g., DDR memory) on the second chip 120. In another example, the first chip 110 includes a memory circuit (e.g., DDR memory) coupled to the transmitter 210. In this example, the signal transmitted by the transmitter 210 may include data (e.g., data read from the memory circuit) to be sent to a memory controller on the second chip 120.

The amplifier 250 in the receiver 240 receives the signal from the transmitter 210 via the link 230, amplifies the signal, and outputs the amplified signal at output 256. For the example in which the second chip 120 includes the memory circuit, the amplifier 250 may output the amplified signal to read/write circuitry (not shown) in the memory circuit. In this example, the read/write circuitry may write data in the signal to one or more memory cells in the memory circuit. For the example in which the second chip 120 includes the memory controller, the amplifier 250 may output the amplified signal to the memory controller. In this example, the memory controller may forward data in the signal to one or more processors on the second chip 120. For the example in which the signal from the transmitter 210 is a differential signal including a first signal and a second signal, the amplifier 250 may receive the first signal at the first input 252 and receive the second signal at the second input 254.

It is to be appreciated that the receiver 240 may include one or more additional components (not shown) in addition to the amplifier 250. For example, the receiver 240 may include one or more output buffers (not shown) coupled to the output 256 of the amplifier 250 is some implementations. It is also to be appreciated that the amplifier 250 is not limited to memory, and may be used in other applications requiring an amplifier.

The amplifier 250 may be implemented using various types of amplifiers. One type of amplifier is a cascode amplifier (e.g., a folded cascode amplifier). However, a cascode amplifier may include a stack of four or more transistors between the supply rail and the low rail (e.g., ground rail), which may require a relatively large supply voltage to keep the transistors operating in the saturation region. As a result, it may be difficult to operate the cascode amplifier at a low supply voltage for low power.

Figure 3A:
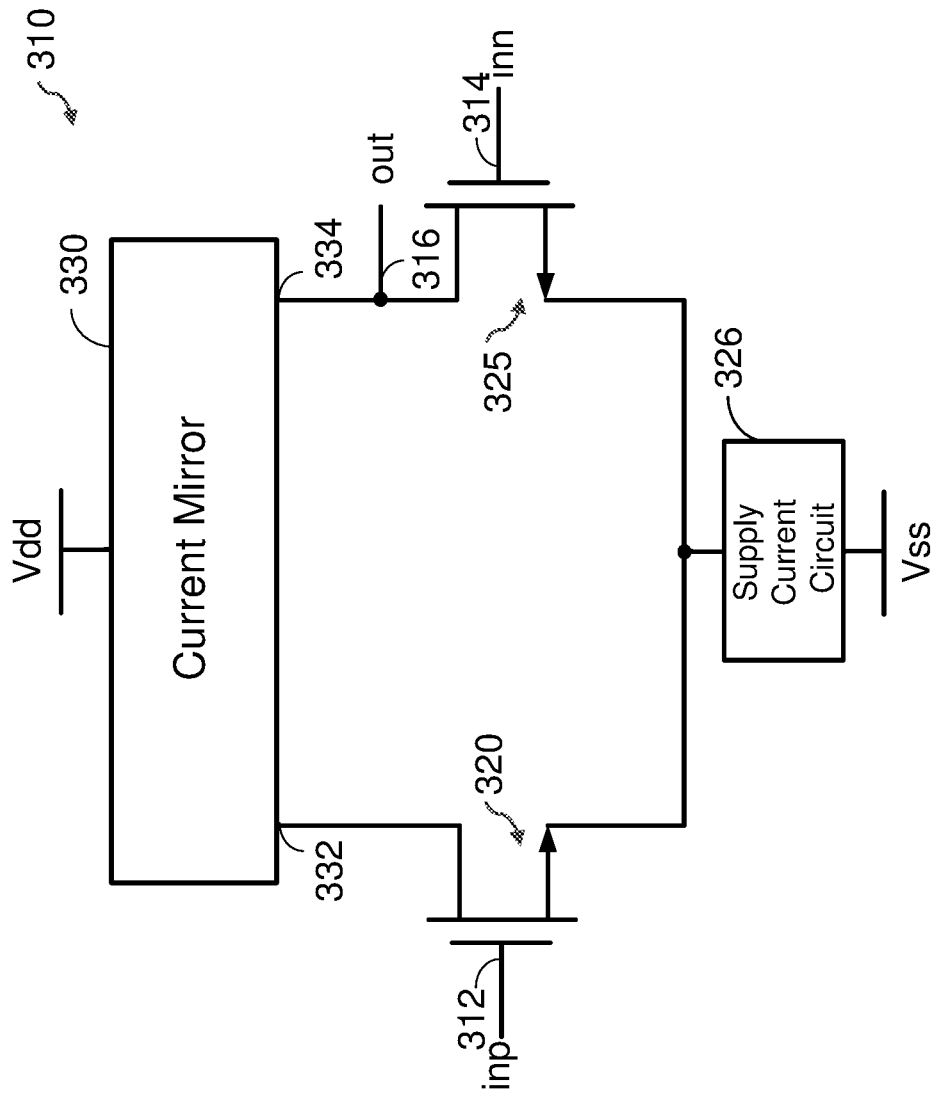
FIG. 3A shows an example of a transconductance amplifier according to certain aspects of the present disclosure.

Another type of amplifier that may be used is a transconductance amplifier. In this regard, FIG. 3A shows an example of a transconductance amplifier 310 according to certain aspects. The transconductance amplifier 310 may also be referred to as an operational transconductance amplifier (OTA). The transconductance amplifier 310 includes a first input transistor 320, a second input transistor 325, a supply current circuit 326, and a current mirror 330. In the example in FIG. 3A, each of the input transistors 320 and 325 is implemented with a respective n-type transistor (e.g., an n-type field effect transistor (NFET), also referred to as an n-type metal-oxide-semiconductor (NMOS) transistor).

The current mirror 330 has an input terminal 332 and an output terminal 334. The current mirror 330 is configured to mirror (i.e., copy) the current flowing through the input terminal 332 at the output terminal 334.

The supply current circuit 326 is configured to control the flow of current from the supply rail, which has a supply voltage Vdd. As discussed further below, the supply current circuit 326 may be implemented with a current-limiting resistor (also referred to as a clamp resistor), a current-source transistor, or the like.

In the example in FIG. 3A, the gate of the first input transistor 320 is coupled to a first input 312 of the transconductance amplifier 310, and the drain of the first input transistor 320 is coupled to the input terminal 322 of the current mirror 330. The gate of the second input transistor 325 is coupled to a second input 314 of the transconductance amplifier 310, and the drain of the second input transistor 325 is coupled to the output 316 of the transconductance amplifier 310. The supply current circuit 326 is coupled between the sources of the input transistors 320 and 325 and the low rail (e.g., ground rail). As used herein, the "low rail" has a lower potential than the supply rail, and may be coupled to ground or another potential lower than the supply voltage Vdd. The output 316 of the transconductance amplifier 310 is between the output terminal 334 of the current mirror 330 and the drain of the second input transistor 325.

In operation, the transconductance amplifier 310 receives a differential input signal (e.g., differential voltage) including a first input signal inp at the first input 312 and a second input signal inn at the second input 314. The input may also be pseudo-differential in some implementations. The first input transistor 320 produces a first current at the drain of the first input transistor 320 based on the first input signal inp, and the second input transistor 325 produces a second current at the drain of the second input transistor 325 based on the second input signal inn. The current mirror 330 mirrors the first current at the output terminal 334 of the current mirror 330, which is coupled to the output 316 of the transconductance amplifier 310. As a result, the first current and the second current are combined at the output 316 of the transconductance amplifier 310. In this example, the voltage gain of the transconductance amplifier 310 may be approximately equal to the transconductance of the transconductance amplifier 310 and the load resistance at the output 316.

Figure 3B:
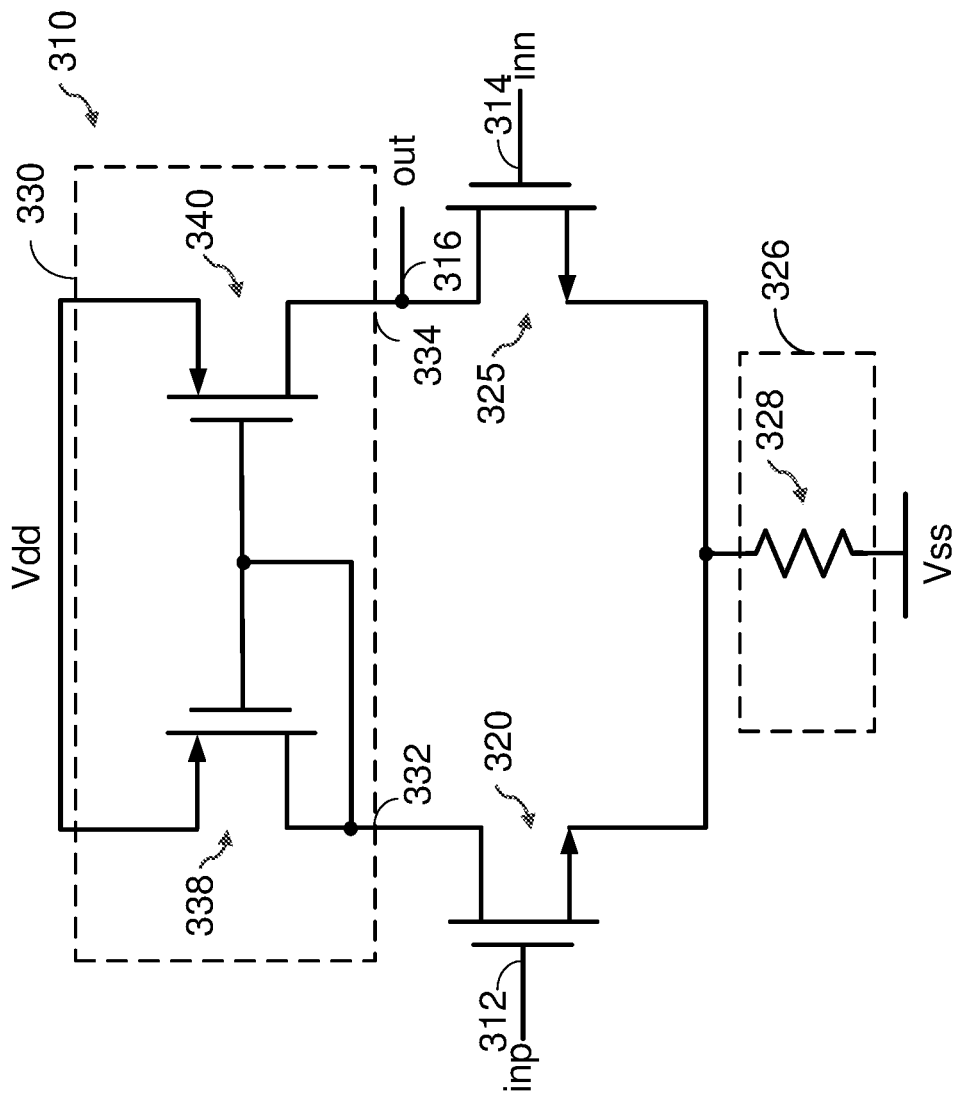
FIG. 3B shows an exemplary implementation of a current mirror in the transconductance amplifier according to certain aspects of the present disclosure.

FIG. 3B shows an exemplary implementation of the current mirror 330 and the supply current circuit 326 according to certain aspects. In this example, the current mirror 330 includes a first current-mirror transistor 338 and a second current-mirror transistor 340, in which each of the current-mirror transistors 338 and 340 is implemented with a respective p-type transistor (e.g., a p-type field effect transistor (PFET), also referred as a p-type metal-oxide-semiconductor (PMOS) transistor). The source of the first current-mirror transistor 338 is coupled to the supply rail, the drain of the first current-mirror transistor 338 is coupled to the input terminal 332, and the gate of the first current-mirror transistor 338 is coupled to the drain of the first current-mirror transistor 338. The source of the second current-mirror transistor 340 is coupled to the supply rail, the drain of the second current-mirror transistor 340 is coupled at the output terminal 334, and the gate of the second current-mirror transistor 340 is coupled to the gate of the first current-mirror transistor 338.

In operation, the current mirror 330 mirrors (i.e., copies) the current flowing through the first current-mirror transistor 338 to the second current-mirror transistor 340. In one example, the current-mirror transistors 338 and 340 may have approximately the same channel width such that the currents flowing through the current-mirror transistors 338 and 340 are approximately equal.

In the example in FIG. 3B, the supply current circuit 326 is implemented with a resistor 328 (also referred to as a current-limiting resistor or a clamp resistor). In this example, the resistance of the resistor 328 helps control the current flow from the supply rail. For example, a lower resistance may be used for the resistor 328 to increase the current flow, and a higher resistance may be used for the resistor 328 to decrease the current flow. It is to be appreciated that the supply current circuit 326 is not limited to this example. For example, in other implementations, the supply current circuit 326 may include a current-source transistor in which the current flow is controlled by a gate bias voltage of the current-source transistor.

To support high data rates, a low resistance may be used for the resistor 328. The low resistance increases the current flow to the transconductance amplifier 310, which increases the bandwidth of the transconductance amplifier 310. However, this also increases the power consumption of the transconductance amplifier 310 due to the higher current. For cases where the transconductance amplifier 310 supports both a high data rate and a low data rate, the increased current may lead to reduced power efficiency at the low data rate (which may not need the increased bandwidth).

Figure 4A:
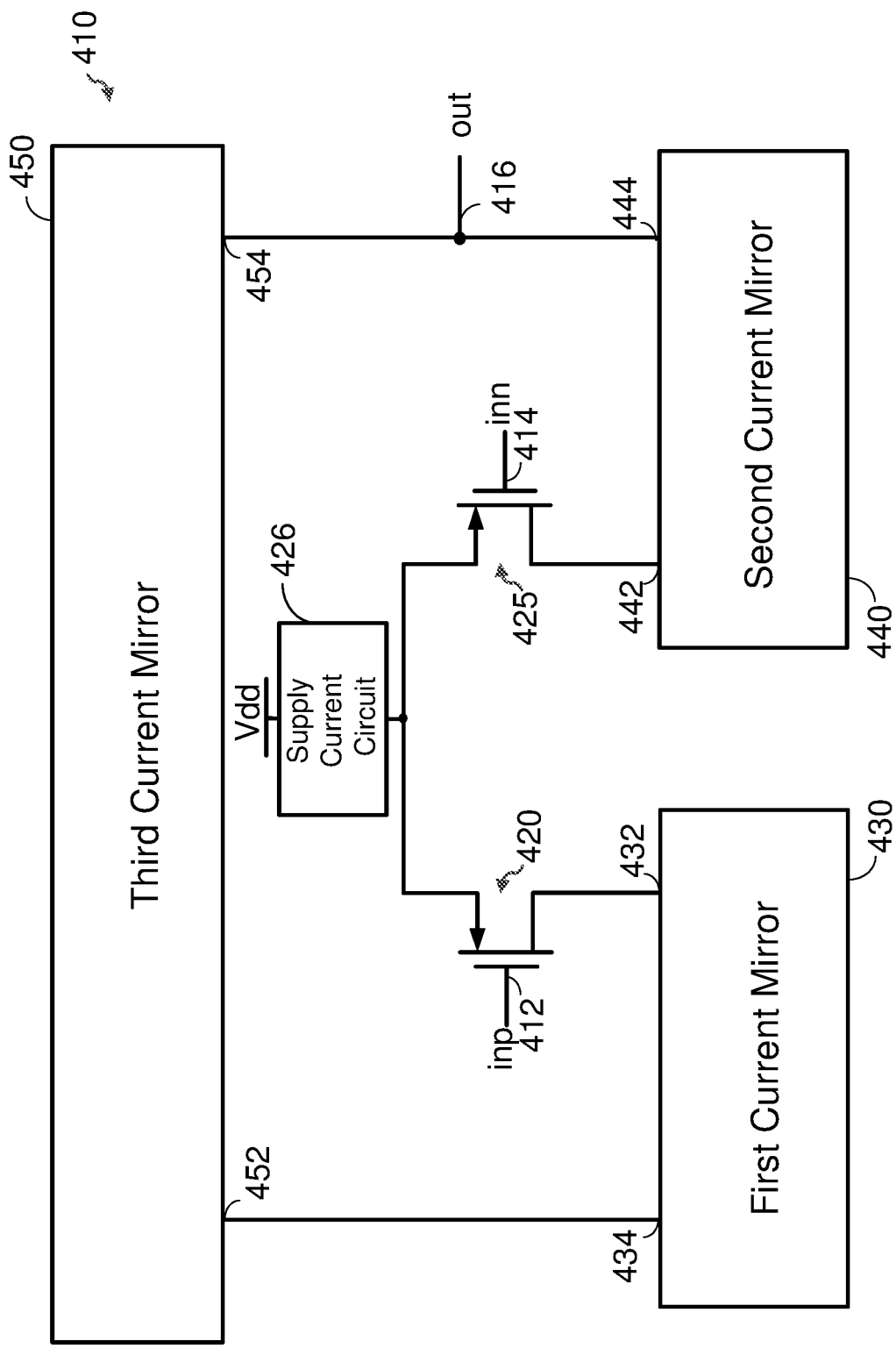
FIG. 4A shows an example of a current-mirror amplifier according to certain aspects of the present disclosure.

Another type of amplifier that may be used is a current-mirror amplifier. In this regard, FIG. 4A shows an example of a current-mirror amplifier 410 according to certain aspects. The current-mirror amplifier 410 may also be referred to as a current-mirror OTA or another term. As discussed further below, the current-mirror amplifier 410 uses one or more current mirrors to provide current multiplication (i.e., current gain) in the amplifier.

The current-mirror amplifier 410 includes a first input transistor 420, a second input transistor 425, a supply current circuit 426, a first current mirror 430, a second current mirror 440, and a third current mirror 450. In the example in FIG. 4A, each of the input transistors 420 and 425 is implemented with a respective p-type transistor (e.g., a p-type field effect transistor (PFET), also referred to as a p-type metal-oxide-semiconductor (PMOS) transistor).

The first current mirror 430 has an input terminal 432 and an output terminal 434. The first current mirror 430 is configured to mirror the current flowing through the input terminal 432 at the output terminal 434, in which the current at the output terminal 434 is equal to the current at the input terminal 432 times a current-mirror factor of the first current mirror 430. Thus, in this example, the first current mirror 430 provides current multiplication based on the current-mirror factor of the first current mirror 430.

The second current mirror 440 has an input terminal 442 and an output terminal 444. The second current mirror 440 is configured to mirror the current flowing through the input terminal 442 at the output terminal 444, in which the current at the output terminal 444 is equal to the current at the input terminal 442 times a current-mirror factor of the second current mirror 440. Thus, in this example, the second current mirror 440 provides current multiplication based on the current-mirror factor of the second current mirror 440. In certain aspects, the current-mirror factor of the second current mirror 440 may be approximately equal to the current-mirror factor of the first current mirror 430.

The third current mirror 450 has an input terminal 452 and an output terminal 454. The third current mirror 450 is configured to mirror the current flowing through the input terminal 452 at the output terminal 454. In certain aspects, the current at the output terminal 454 may be approximately equal to the current at the input terminal 452.

The supply current circuit 426 is configured to control the flow of current from the supply rail. As discussed further below, the supply current circuit 426 may be implemented with a current-limiting resistor (also referred to as a clamp resistor), a current-source transistor, or the like.

In the example in FIG. 4A, the gate of the first input transistor 420 is coupled to a first input 412 of the current-mirror amplifier 410, and the drain of the first input transistor 420 is coupled to the input terminal 432 of the first current mirror 430. The gate of the second input transistor 425 is coupled to a second input 414 of the current-mirror amplifier 410, and the drain of the second input transistor 425 is coupled to the input terminal 442 of the second current mirror 440. The supply current circuit 426 is coupled between the supply rail and the sources of the input transistors 420 and 425. The output terminal 434 of the first current mirror 430 is coupled to the input terminal 452 of the third current mirror 450, the output terminal 454 of the third current mirror 450 is coupled to the output 416 of the current-mirror amplifier 410, and the output terminal 444 of the second current mirror 440 is coupled to the output 416 of the current-mirror amplifier 410.

In operation, the current-mirror amplifier 410 receives a differential input signal (e.g., differential voltage) including a first input signal inp at the first input 412 and a second input signal inn at the second input 414. The input may also be pseudo-differential in some implementations. The first input transistor 420 produces a first current at the drain of the first input transistor 420 based on the first input signal inp, and the second input transistor 425 produces a second current at the drain of the second input transistor 425 based on the second input signal inn. The first current mirror 430 multiplies the first current by the current-mirror factor of the first current mirror 430, and provides the multiplied first current to the third current mirror 450. The third current mirror 450 mirrors the multiplied first current at the output terminal 454 of the third current mirror 450, which is coupled to the output 416 of the current-mirror amplifier 410. The second current mirror 440 multiplies the second current by the current-mirror factor of the second current mirror 440, and provides the multiplied second current to the output 416 of the current-mirror amplifier 410. Thus, the multiplied first current and the multiplied second current are provided to the output 416 of the current-mirror amplifier 410, and are thus combined at the output 416 of the current-mirror amplifier 410. In this example, the voltage gain of the current-mirror amplifier 410 may be approximately equal to the transconductance of the current-mirror amplifier 410 and the load resistance at the output 416.

Figure 4B:
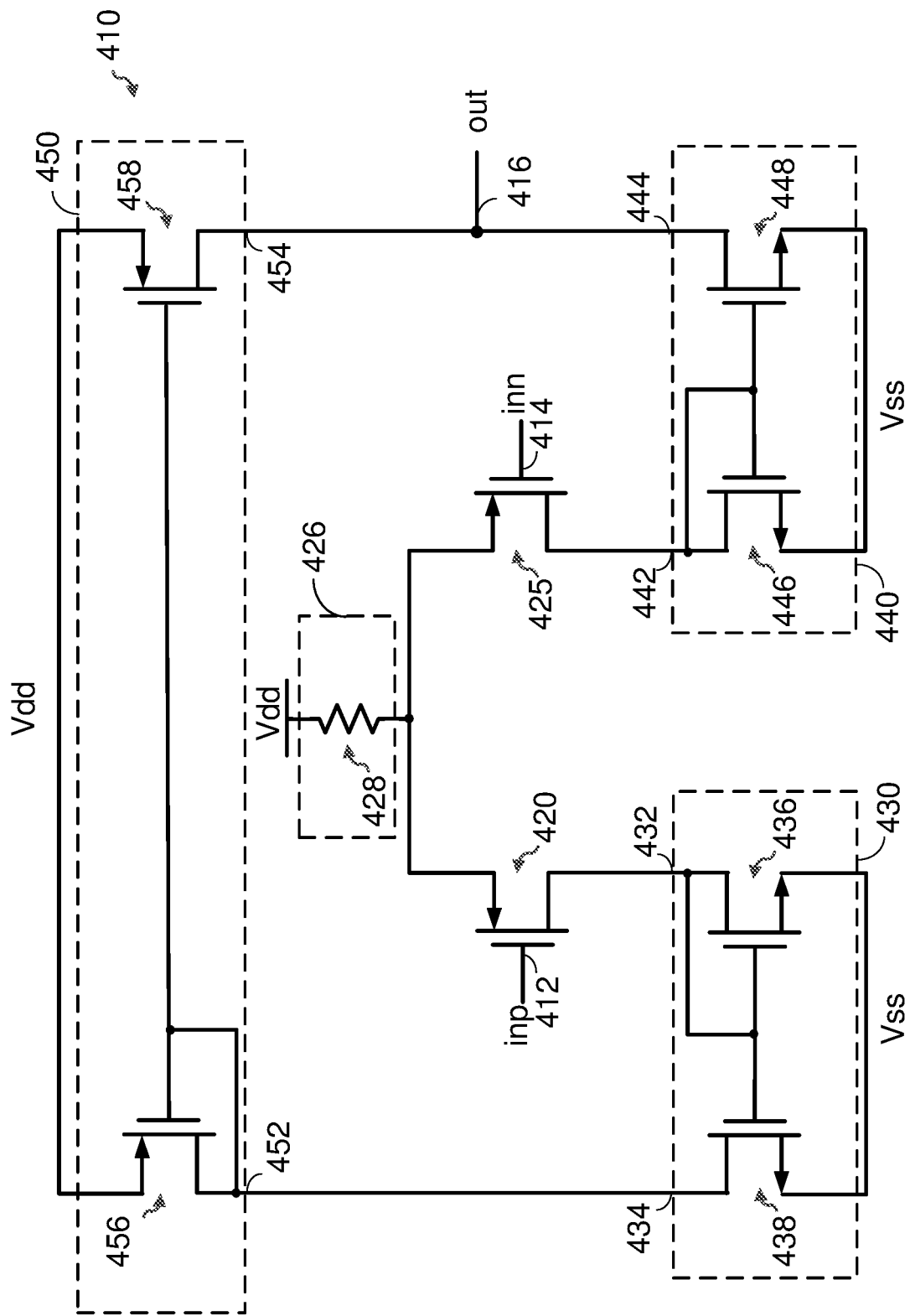
FIG. 4B shows an exemplary implementation of current mirrors in the current-mirror amplifier according to certain aspects of the present disclosure.

FIG. 4B shows an exemplary implementation of the first current mirror 430, the second current mirror 440, the third current mirror 450, and the supply current circuit 426 according to certain aspects. In this example, the first current mirror 430 includes a first current-mirror transistor 436 and a second current-mirror transistor 438, in which each of the current-mirror transistors 436 and 438 is implemented with a respective n-type transistor. The drain of the first current-mirror transistor 436 is coupled to the input terminal 432, the source of the first current-mirror transistor 436 is coupled to the low rail (e.g., ground), and the gate of the first current-mirror transistor 436 is coupled to the drain of the first current-mirror transistor 436. The drain of the second current-mirror transistor 438 is coupled to output terminal 434, the source of the second current-mirror transistor 438 is coupled to the low rail (e.g., ground), and the gate of the second current-mirror transistor 438 is coupled to the gate of the first current-mirror transistor 436. In one example, the current-mirror factor of the first current mirror 430 may be based on a ratio of the channel width of the second current-mirror transistor 438 over the channel width of the first current-mirror transistor 436.

In this example, the second current mirror 440 includes a third current-mirror transistor 446 and a fourth current-mirror transistor 448, in which each of the current-mirror transistors 446 and 448 is implemented with a respective n-type transistor. The drain of the third current-mirror transistor 446 is coupled to the input terminal 442, the source of the third current-mirror transistor 446 is coupled to the low rail (e.g., ground), and the gate of the third current-mirror transistor 446 is coupled to the drain of the third current-mirror transistor 446. The drain of the fourth current-mirror transistor 448 is coupled to output terminal 444, the source of the fourth current-mirror transistor 448 is coupled to the low rail (e.g., ground), and the gate of the fourth current-mirror transistor 448 is coupled to the gate of the third current-mirror transistor 446. In one example, the current-mirror factor of the second current mirror 440 may be based on a ratio of the channel width of the fourth current-mirror transistor 448 over the channel width of the third current-mirror transistor 446.

In this example, the third current mirror 450 includes a fifth current-mirror transistor 456 and a sixth current-mirror transistor 458, in which each of the current-mirror transistors 456 and 458 is implemented with a respective p-type transistor. The source of the fifth current-mirror transistor 456 is coupled to the supply rail, the drain of the fifth current-mirror transistor 456 is coupled to the input terminal 452, and the gate of the fifth current-mirror transistor 456 is coupled to the drain of the fifth current-mirror transistor 456. The source of the sixth current-mirror transistor 458 is coupled to the supply rail, the drain of the sixth current-mirror transistor 458 is coupled at the output terminal 454, and the gate of the sixth current-mirror transistor 458 is coupled to the gate of the fifth current-mirror transistor 456. In one example, the current-mirror transistors 456 and 458 may have approximately the same channel width such that the currents flowing through the current-mirror transistors 456 and 458 are approximately equal.

In the example in FIG. 4B, the supply current circuit 426 is implemented with a resistor 428 (also referred to as a current-limiting resistor or a clamp resistor) coupled between the sources of the first and second input transistors 420 and 425 and the supply rail. In this example, the resistance of the resistor 428 helps control the current flow from the supply rail. It is to be appreciated that the supply current circuit 426 is not limited to this example. For example, in other implementations, the supply current circuit 426 may include a current-source transistor in which the current flow is controlled by a gate bias voltage of the current-source transistor.

To support high data rates, a high current-mirror factor may be used for each of the first and second current mirrors 430 and 440. The high current-mirror factor increases the currents at the output terminals 434 and 444 of the first and second current mirrors 430 and 440 for a given input, which increases the transconductance and hence bandwidth of the current-mirror amplifier 410. However, this also increases the power consumption of the current-mirror amplifier 410 due to the higher currents. For cases where the current-mirror amplifier 410 supports both a high data rate and a low data rate, the increased current may lead to reduced power efficiency at the low data rate (which may not need the increased bandwidth).

Aspects of the present disclosure provide hybrid amplifiers including elements of a transconductance amplifier (e.g., transconductance amplifier 310) and elements of a current-mirror amplifier (e.g., current-mirror amplifier 410). For example, a hybrid amplifier according to certain aspects may include elements of a transconductance amplifier with n-type input transistors and elements of a current-mirror amplifier with p-type input transistors. Various features of hybrid amplifiers according to aspects of the present disclosure are discussed in further detail below.

Figure 5:
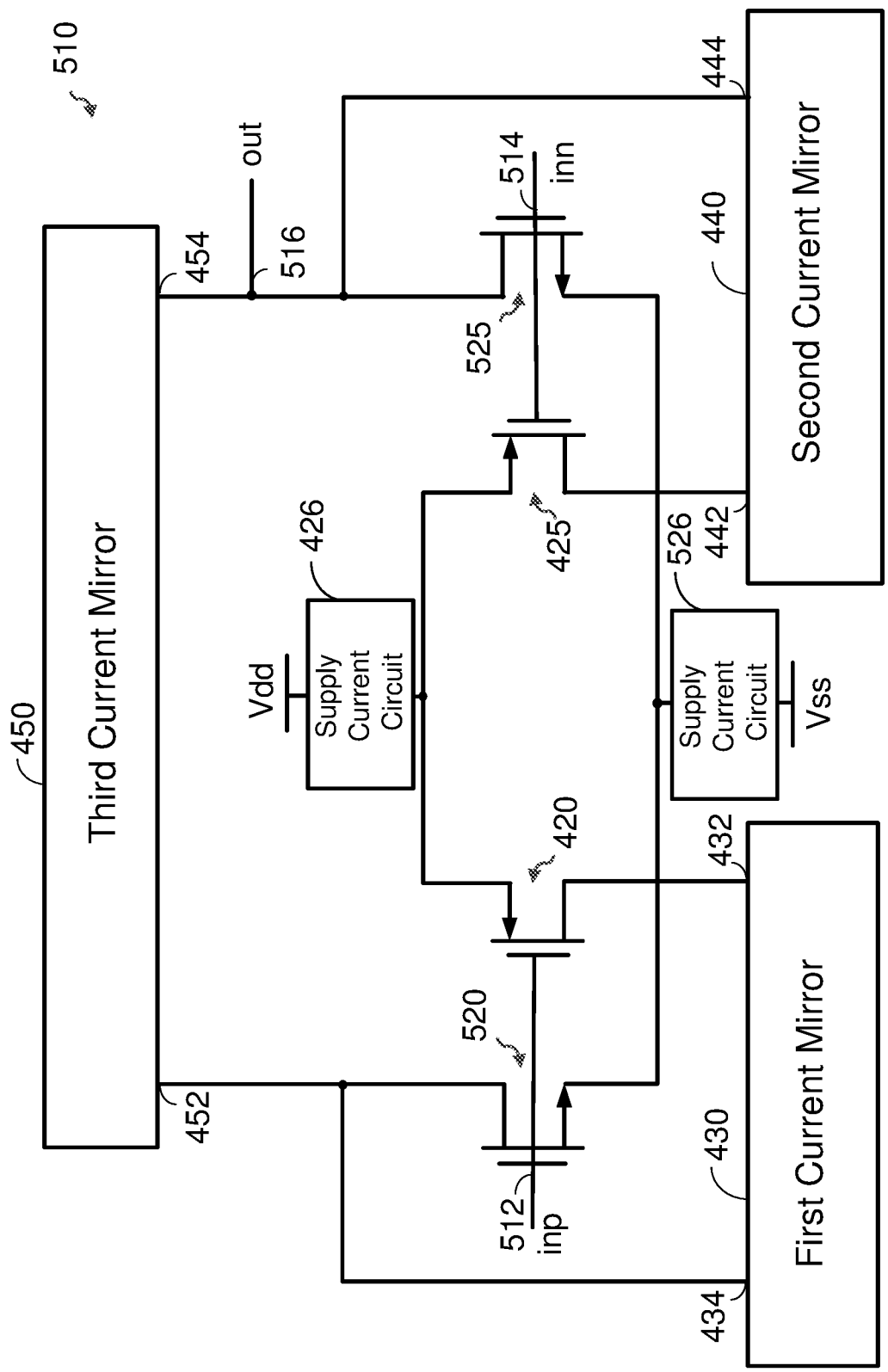
FIG. 5 shows an example of a hybrid amplifier according to certain aspects of the present disclosure.

FIG. 5 shows an example of a hybrid amplifier 510 according to certain aspects of the present disclosure. The hybrid amplifier 510 has a first input 512, a second input 514, and an output 516. The hybrid amplifier 510 may be used, for example, to implement the amplifier 250 in FIG. 2. In this example, the first input 512 corresponds to the first input 252, the second input 514 corresponds to the second input 254, and the output 516 corresponds to the output 256. However, it is to be appreciated that the hybrid amplifier 510 is not limited to this example.

In the example in FIG. 5, the hybrid amplifier 510 includes the exemplary current-mirror amplifier 410 shown in FIG. 4A, in which the first input 412 (shown in FIG. 4A) of the current-mirror amplifier 410 is coupled to the first input 512 of the hybrid amplifier 510, the second input 414 (shown in FIG. 4A) of the current-mirror amplifier 410 is coupled to the second input 514 of the hybrid amplifier 510, and the output 416 (shown in FIG. 4A) of the current-mirror amplifier 410 is coupled to the output 516 of the hybrid amplifier 510. Since the current-mirror amplifier 410 is described above with reference to FIG. 4A according to certain aspects, a detailed description of the current-mirror amplifier 410 is not repeated here for brevity. In the discussion below, the supply current circuit 426 is referred to as the first supply current circuit 426.

The hybrid amplifier 510 also include elements of a transconductance amplifier (e.g., transconductance amplifier 310) including a third input transistor 520, a fourth input transistor 525, and a second supply current circuit 526. For example, the third input transistor 520 may correspond to the first input transistor 320 shown in FIG. 3A, the fourth input transistor 525 may correspond to the second input transistor 325 shown in FIG. 3A, and the second supply current circuit 526 may correspond to the supply current circuit 326 shown in FIG. 3A. In certain aspects, the third current mirror 450 of the current-mirror amplifier 410 may also serve as the current mirror 330 of the transconductance amplifier 310 shown in FIG. 3A.

In this example, each of the third and fourth input transistors 520 and 525 is implemented with a respective n-type transistor. Thus, in this example, the first and second input transistors 420 and 425 are p-type transistors while the third and fourth input transistors 520 and 525 are n-type transistors. As discussed further below, using both p-type input transistors and n-type input transistors helps extend the input voltage range of the hybrid amplifier 510 compared with an amplifier that only use input transistors of the same transistor channel type.

In the example in FIG. 5, the gate of the third input transistor 520 is coupled to the first input 512 of the hybrid amplifier 510, and the drain of the third input transistor 520 is coupled to the input terminal 452 of the third current mirror 450. The gate of the fourth input transistor 525 is coupled to the second input 514 of the hybrid amplifier 510, and the drain of the fourth input transistor 525 is coupled to the output 516 of the hybrid amplifier 510. The supply current circuit 526 is coupled between the sources of the third and fourth input transistors 520 and 525 and the low rail (e.g., ground rail). The supply current circuit 526 may be implemented with a current-limiting resistor, a current-source transistor, or the like.

In operation, the hybrid amplifier 510 receives a differential input signal (e.g., differential voltage) including a first input signal inp at the first input 512 and a second input signal inn at the second input 514. The input may also be pseudo-differential in some implementations. The first input transistor 420 produces a first current at the drain of the first input transistor 420 based on the first input signal inp, the second input transistor 425 produces a second current at the drain of the second input transistor 425 based on the second input signal inn, the third input transistor 520 produces a third current at the drain of the third input transistor 520 based on the first input signal inp, and the fourth input transistor 525 produces a fourth current at the drain of the fourth input transistor 525 based on the second input signal inn.

The first current mirror 430 multiples the first current from the first input transistor 420 by the current-mirror factor of the first current mirror 430, and provides the multiplied first current to input terminal 452 of the third current mirror 450. The third current from the third input transistor 520 is also provided to the input terminal 452 of the third current mirror 450 (which is coupled to the third input transistor 520). Thus, the input terminal 452 of the third current mirror 450 receives a combination of the multiplied first current and the third current. The third current mirror 450 mirrors the combination of the multiplied first current and the third current at the output terminal 454 of the third current mirror 450, which is coupled to the output 516 of the hybrid amplifier 510. Thus, the output terminal 454 of the third current mirror 450 provides the combination of the multiplied first current and the third current to the output 516 of the hybrid amplifier 510.

The second current mirror 440 multiples the second current from the second input transistor 425 by the current-mirror factor of the second current mirror 440, and provides the multiplied second current to the output 516 of the hybrid amplifier 510. The fourth current from the fourth input transistor 525 is also provided to the output 516 of the hybrid amplifier 510. Thus, the output 516 receives a combination of the multiplied second current and the fourth current.

Therefore, the multiplied first current, the multiplied second current, the third current, and the fourth current are combined at the output 516 of the hybrid amplifier 510. In this example, the voltage gain of the hybrid amplifier 510 may be approximately equal to the transconductance of the hybrid amplifier 510 and the load resistance at the output 516.

As discussed above, using different transistor channel types for the first and second input transistors 420 and 425 and the third and fourth input transistors 520 and 525 helps extend the input voltage range of the hybrid amplifier 510. For example, in the example shown in FIG. 5, the first and second input transistors 420 and 425 (which are p-type in this example) may primarily drive the hybrid amplifier 510 at low input voltages (e.g., voltages below the threshold voltages of the third and fourth input transistors 520 and 525), and the third and fourth input transistors 520 and 525 (which are n-type in this example) may primarily drive the hybrid amplifier 510 at high input voltages (e.g., voltages above the supply voltage Vdd minus the threshold voltages of the first and second input transistors 420 and 425). Although the first and second input transistors 420 and 425 are p-type and the third and fourth input transistors 520 and 525 are n-type in the example shown in FIG. 5, it is to be understood that the present disclosure is not limited to this example. For example, in some implementations, the first and second input transistors 420 and 425 may be n-type and the third and fourth input transistors 520 and 525 may be p-type. In general, the first and second input transistors 420 and 425 are of a different transistor channel type than the third and fourth input transistors 520 and 525.

Figure 6:
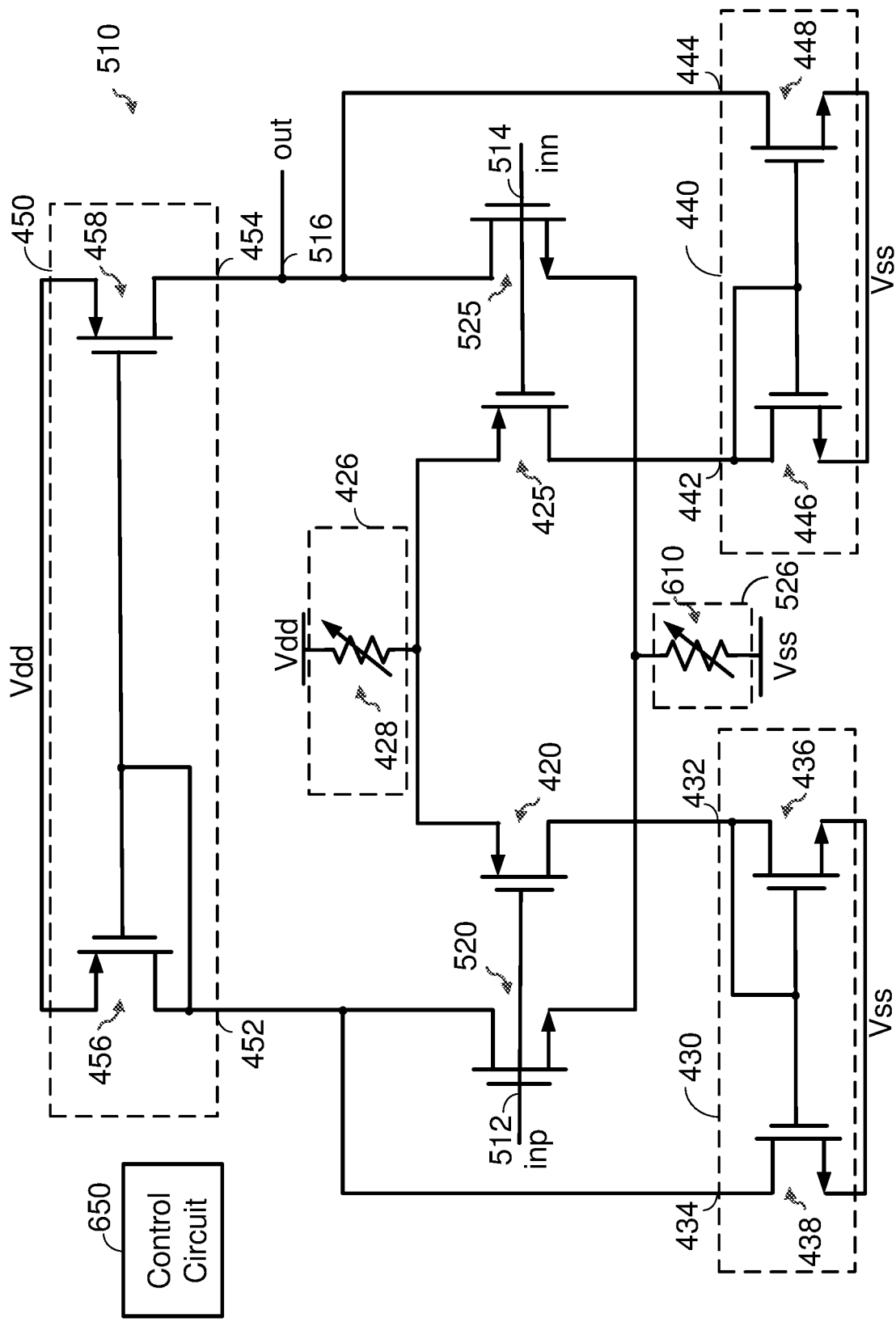
FIG. 6 shows an exemplary implementation of current mirrors in the hybrid amplifier according to certain aspects of the present disclosure.

FIG. 6 shows an exemplary implementation of the first current mirror 430, the second current mirror 440, the third current mirror 450, the first supply current circuit 426, and the second supply current circuit 526 according to certain aspects. In this example, the first current mirror 430 includes the first current-mirror transistor 436 and the second current-mirror transistor 438 discussed above, the second current mirror 440 includes the third current-mirror transistor 446 and the fourth current-mirror transistor 448 discussed above, and the third current mirror 450 includes the fifth current-mirror transistor 456 and the sixth current-mirror transistor 458 discussed above. Since the current-mirror transistors 436, 438, 446, 448, 456, and 458 are described above with reference to FIG. 4B according to certain aspects, a detailed description of the current-mirror transistors 436, 438, 446, 448, 456, and 458 is not repeated here for brevity.

In this example, the first supply current circuit 426 includes the resistor 428 discussed above with reference to FIG. 4B. In the discussion below, the resistor 428 is referred to as the first resistor 428. In this example, the second supply current circuit 526 includes a second resistor 610 (also referred to as a current-limiting resistor or a clamp resistor) coupled between the sources of the third and fourth input transistors 520 and 520 and the low rail (e.g., ground rail).

In the example shown in FIG. 6, the hybrid amplifier 510 includes stacks of two transistors between the supply rail and the low rail. In contrast, a cascode amplifier (e.g., folded cascode amplifier) may have stacks of four or more transistors between the rails. The smaller stacks of transistors between the rails in the hybrid amplifier 510 allow the hybrid amplifier 510 to operate at a lower supply voltage than the cascode amplifier.

The exemplary hybrid amplifier 510 may allow a large voltage swing at the output 516 (e.g., approximately rail-to-rail output voltage swing assuming small voltage drops across the transistors 458 and 448). In the example in FIG. 6, the IR voltage drop across the first resistor 428 has little to no impact on the output voltage swing of the hybrid amplifier 510. This is because the first resistor 428 is not located between the supply voltage and output 516 of the hybrid amplifier 510.

In certain aspect, the first resistor 428 may be implemented with a respective variable resistor having an adjustable (i.e., programmable) resistance. Also, the second resistor 610 may be implemented with a respective variable resistor having an adjustable (i.e., programmable) resistance. Exemplary implementations of variable resistors are discussed further below with reference to FIGS. 10A and 10B. In certain aspects, the resistance of the first resistor 428 and the resistance of the second resistor 610 are controlled by a control circuit 650.

In one example, the hybrid amplifier 510 may support multiple data rates including a first data rate and a second data rate, in which the first data rate (e.g., low data rate) is lower than the second data rate (e.g., high data rate). For example, in the example where the hybrid amplifier 510 implements the amplifier 250 shown in FIG. 2, the transmitter 210 may transmit data signals at any one of the multiple data rates (e.g., based on use case). In this example, the control circuit 650 may set (i.e., program) the resistance of the first resistor 428 and the resistance of the second resistor 610 based on the current data rate of the signal being received by the hybrid amplifier 510.

For example, the control circuit 650 may set the resistance of the first resistor 428 to a first resistance value for the first data rate (e.g., low data rate) and set the resistance of the first resistor 428 to a second resistance value for the second data rate (e.g., high data rate), in which the second resistance value is lower than the first resistance value. Thus, in this example, the control circuit 650 sets the resistance of the first resistor 428 lower for the second data rate (e.g., high data rate) compared with the first data rate (e.g., low data rate). The lower resistance at the second data rate (e.g., high data rate) increases the current from the supply rail, which helps increase the bandwidth of the hybrid amplifier 510, allowing the hybrid amplifier 510 to operate at higher data rates. In this example, the control circuit 650 sets the resistance of the first resistor 428 higher for the first data rate (e.g., low data rate) compared with the second data rate (e.g., high data rate). The higher resistance at the first data rate (e.g., low data rate) decreases the current from the supply rail, which helps reduce power consumption at the first data rate. The current (and hence the power) can be reduced for the first data rate because the hybrid amplifier 510 can operate with a smaller bandwidth at a lower data rate. Thus, by setting (i.e., programming) the resistance of the first resistor 428 based on data rate, the control circuit 650 helps the hybrid amplifier 510 operate at a high data rate while reducing the power for a low data rate to improve power efficiency at the low data rate.

In this example, the control circuit 650 may also set the resistance of the second resistor 610 to a third resistance value for the first data rate (e.g., low data rate), and set the resistance of the second resistor 610 to a second resistance value for the second data rate (e.g., high data rate), in which the fourth resistance value is lower than the third resistance value. Thus, in this example, the control circuit 650 sets the resistance of the second resistor 610 lower for the second data rate (e.g., high data rate) compared with the first data rate (e.g., low data rate). As discussed above, this helps the hybrid amplifier 510 operate at a high data rate while reducing the power for a low data rate to improve power efficiency at the low data rate. The third resistance value may be the same as or different from the first resistance value, and the fourth resistance value may be the same as or different from the second resistance value.

In certain aspect, the first current mirror 430 may have an adjustable (i.e., programmable) current-mirror factor and the second current mirror 440 may have an adjustable (i.e., programmable) current-mirror factor. In the discussion below, the current-mirror factor of the first current mirror 430 is referred to as the first current-mirror factor and the current-mirror factor of the second current mirror 440 is referred to as the second current-mirror factor.

For the example where the hybrid amplifier 510 supports multiple data rates including the first data rate (e.g., low data rate) and the second data rate (e.g., high data rate), the control circuit 650 may set the first-mirror factor based on the current data rate of the signal being received by the hybrid amplifier 510. For example, the control circuit 650 may set the first current-mirror factor to a first factor value for the first data rate (e.g., low data rate), and set the first current-mirror factor to a second factor value for the second data rate (e.g., high data rate), in which the second factor value is greater than the first factor value.

Thus, in this example, the control circuit 650 sets the first current-mirror factor to a higher factor value for the second data rate (e.g., high data rate) compared with the first data rate (e.g., low data rate). The higher factor value for the second data rate (e.g., high data rate) increases the current multiplication of the first current mirror 430. The increased current multiplication (i.e., current gain) increases the current at the output terminal 434 of the first current mirror 430, which helps increase the bandwidth of the hybrid amplifier 510, allowing the hybrid amplifier 510 to operate at higher data rates (i.e., frequencies). The lower factor value for the first data rate (e.g., low data rate) decreases the current multiplication of the first current mirror 430, which helps reduce power consumption at the first data rate. Thus, by setting (i.e., programming) the first current-mirror factor based on data rate, the control circuit 650 helps the hybrid amplifier 510 operate at a high data rate while reducing the power for a low data rate to improve power efficiency at the low data rate.

In this example, the control circuit 650 may also set the second current-mirror factor to a third factor value for the first data rate (e.g., low data rate), and set the second current-mirror factor to a fourth factor value for the second data rate (e.g., high data rate), in which the fourth factor value is greater than the third factor value. Thus, in this example, the control circuit 650 sets the second current-mirror factor to a higher value for the second data rate (e.g., high data rate) compared with the first data rate (e.g., low data rate). As discussed above, this helps the hybrid amplifier 510 operate at a high data rate while reducing the power for a low data rate to improve power efficiency at the low data rate. The third factor value may be the same as or different from the first factor value, and the fourth factor value may be the same as or different from the second factor value.

Figure 7:
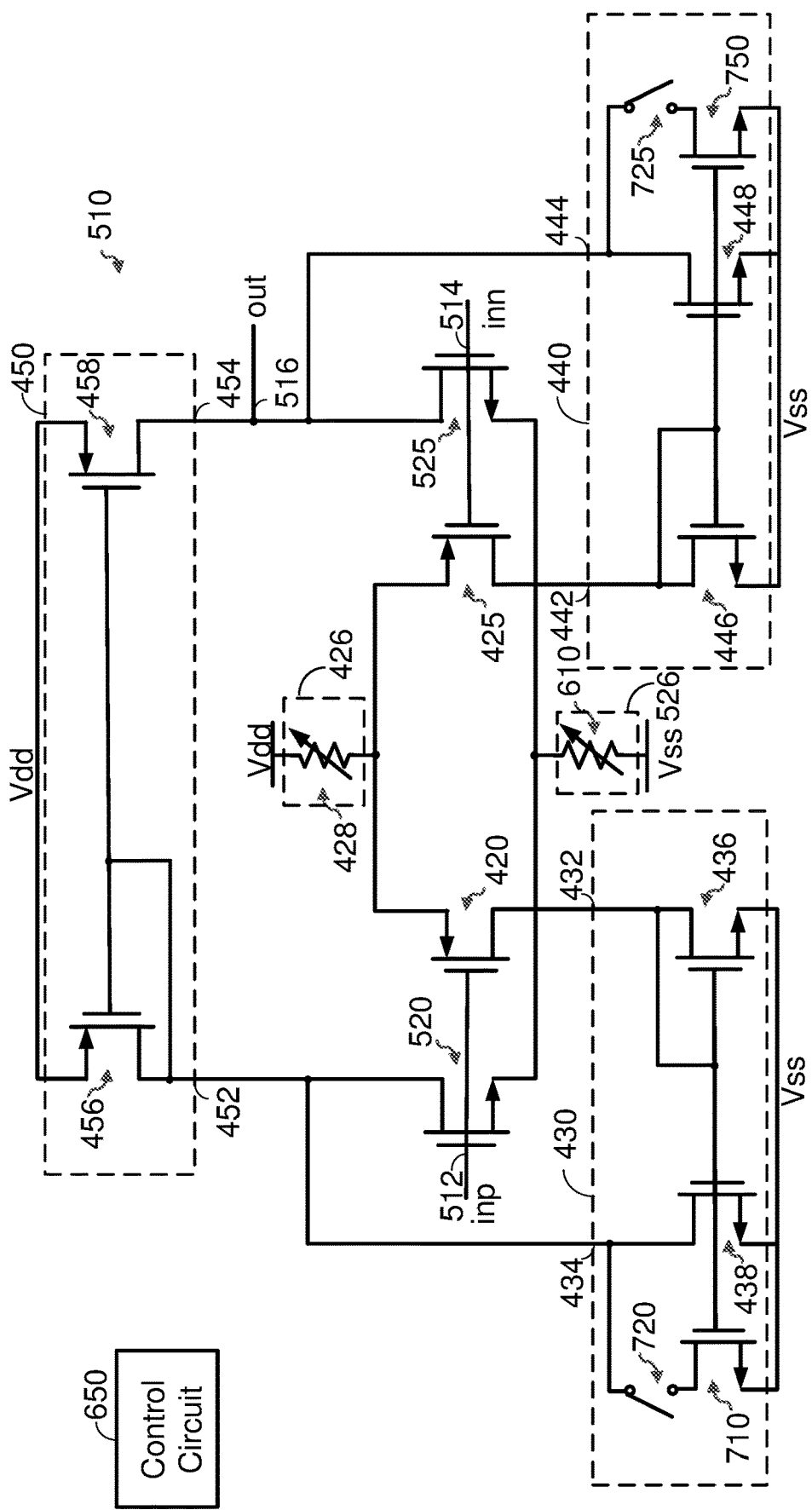
FIG. 7 shows an example of the current mirrors with adjustable current-mirror factors according to certain aspects of the present disclosure.

FIG. 7 shows an exemplary implementation of the first current mirror 430 and the second current mirror 440 with programmable current-mirror factors according to certain aspects. In this example, the first current mirror 430 further includes a first current-mirror switch 720 and a seventh current-mirror transistor 710 coupled in series between the output terminal 434 and the low rail. In this example, the control circuit 650 may set the first current-mirror factor to the first factor value by opening (i.e., turning off) the first current-mirror switch 720, and set the first current-mirror factor to the second factor value by closing (i.e., turning on) the first current-mirror switch 720. Turning on the first current-mirror switch 720 couples the seventh current-mirror transistor 710 in parallel with the second current-mirror transistor 438, which increases the first current-mirror factor.

In the example in FIG. 7, the second current mirror 440 further includes a second current-mirror switch 725 and an eighth current-mirror transistor 750 coupled in series between the output terminal 444 and the low rail. In this example, the control circuit 650 may set the second current-mirror factor to the third factor value by opening (i.e., turning off) the second current-mirror switch 725, and set the second current-mirror factor to the fourth factor value by closing (i.e., turning on) the second current-mirror switch 725. Turning on the second current-mirror switch 725 couples the eighth current-mirror transistor 750 in parallel with the fourth current-mirror transistor 448, which increases the second current-mirror factor.

It is to be appreciated that each of the current mirrors 430 and 440 may include one or more additional switches (not shown) and one or more additional current-mirror transistors (not shown) to allow the control circuit 650 to selectively set the current-mirror factor of each of the current mirrors 430 and 440 to more than two factor values.

In certain aspects, the hybrid amplifier 510 may be placed in a disabled mode (also referred to as an idle or standby mode) to conserve power when the hybrid amplifier 510 is not in use (e.g., the transmitter 210 is not transmitting to the receiver 240). In the disabled mode, it is desirable to reduce leakage current through the hybrid amplifier 510 to reduce power loss in the disabled mode (i.e., reduce standby power). In this regard, the hybrid amplifier 510 may include switches and/or other devices for cutting off leakage paths in the hybrid amplifier 510 in the disabled mode to reduce power loss due to current leakage.

Figure 8A:
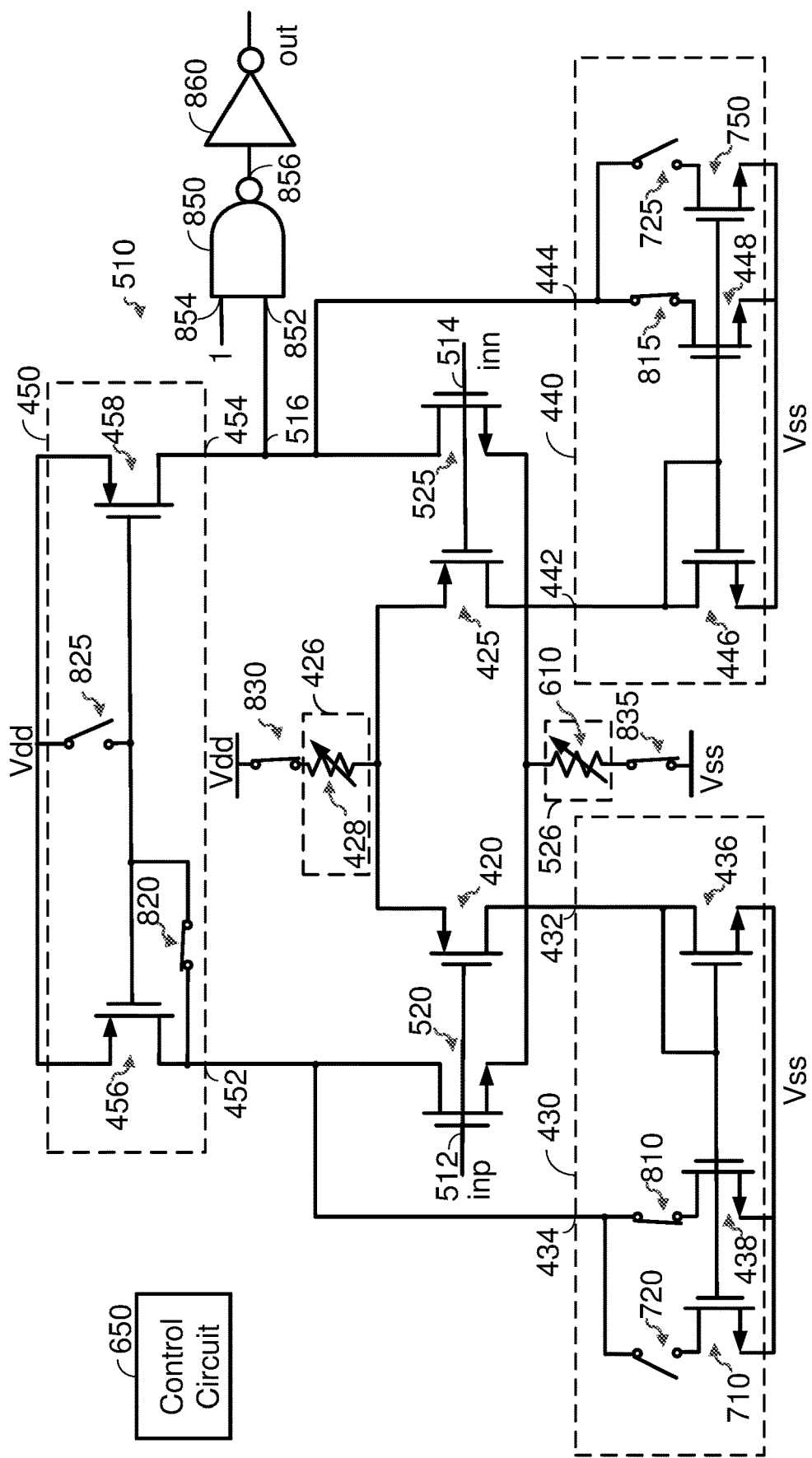
FIG. 8A shows an example of the hybrid amplifier with leakage-control switches in a first mode according to certain aspects of the present disclosure.
Figure 8B:
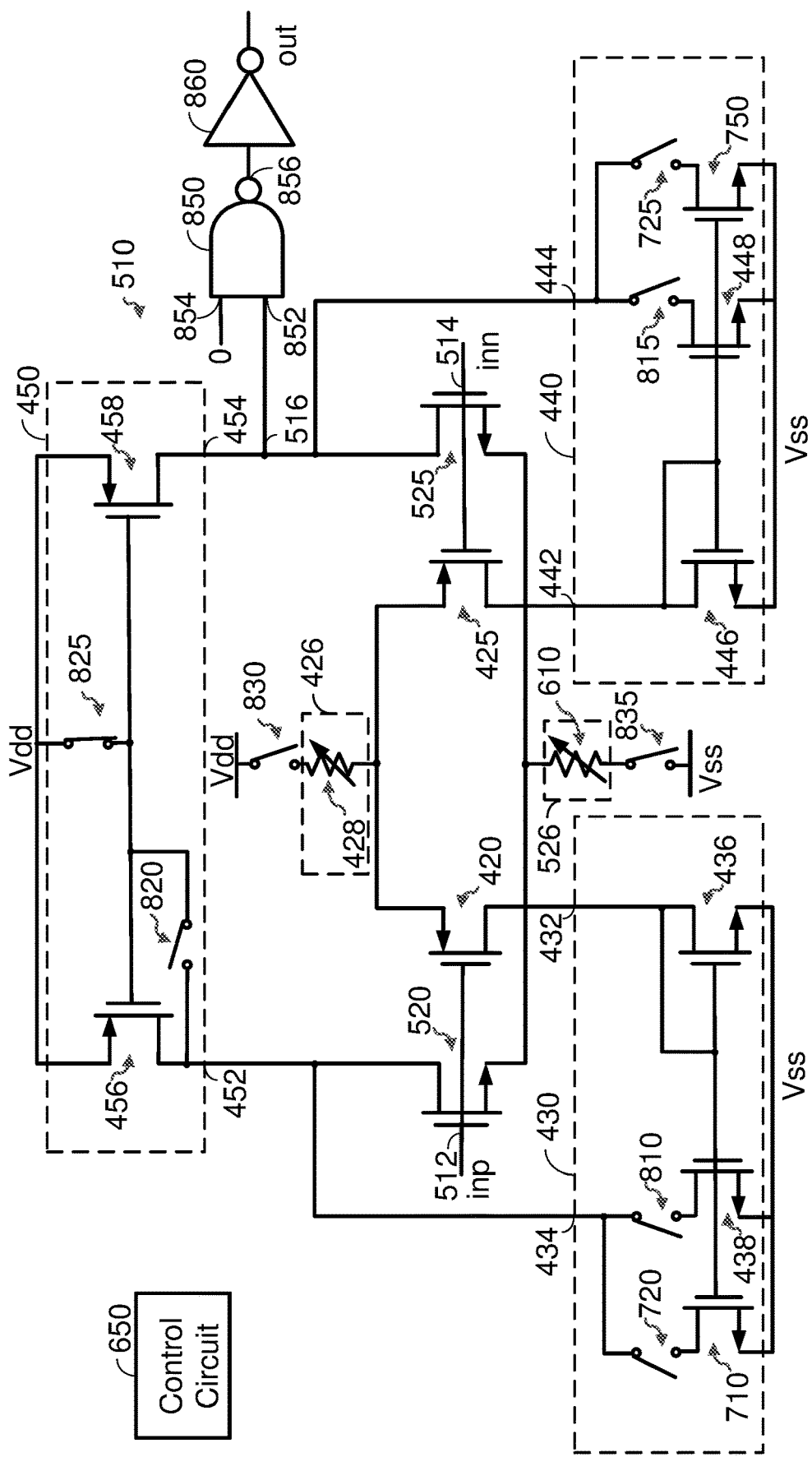
FIG. 8B shows an example of the hybrid amplifier with the leakage-control switches in a second mode according to certain aspects of the present disclosure.

FIGS. 8A and 8B show an example in which the hybrid amplifier 510 includes a first switch 810, a second switch 815, a third switch 820, a fourth switch 825, a fifth switch 830, and a sixth switch 835. FIG. 8A shows the on/off states of the switches 810, 815, 820, 825, 830, and 835 in the enabled mode (also referred to as the active mode), and FIG. 8B the on/off states of the switches 810, 815, 820, 825, 830, and 835 in the disabled mode.

The first switch 810 is coupled between the drain of the second current-mirror transistor 438 and the output terminal 434, and the second switch 815 is coupled between the drain of the fourth current-mirror transistor 448 and the output terminal 444. In the enabled mode, the control circuit 650 closes (i.e., turns on) the first switch 810 and the second switch 815, as shown in FIG. 8A. In the disabled mode, the control circuit 650 opens (i.e., turns off) the first switch 810 and the second switch 815. Opening the first switch 810 and the second switch 815 cuts the leakage paths through the first current mirror 430 and the second current mirror 440.

The third switch 820 is coupled between the gate of the fifth current-mirror transistor 456 and the drain of the fifth current-mirror transistor 456. In the enabled mode, the control circuit 650 closes (i.e., turns on) the third switch 820, as shown in FIG. 8A. In the disabled mode, the control circuit 650 opens (i.e., turns off the third switch 820). Opening the third switch 820 cuts the feedback path between the gate and drain of the fifth current-mirror transistor 456.

The fourth switch 825 is coupled between the supply rail and the gates of the fifth and sixth current-mirror transistors 456 and 458. In the enabled mode, the control circuit 650 opens (i.e., turns off) the fourth switch 825. In the disabled mode, the control circuit 650 closes (i.e., turns on) the fourth switch 825, which shorts the source and the gate of the fifth current-mirror transistor 456 and shorts the source and the gate of the sixth current-mirror transistor 458. As a result, the fifth current-mirror transistor 456 and the sixth current-mirror transistor 458 are turned off in the disabled mode, which helps block leakage current from flowing through the fifth current-mirror transistor 456 and the sixth current-mirror transistor 458. In the disabled mode, the third switch 820 is open (i.e., turned off), which blocks leakage current between the gate and the drain of the fifth current-mirror transistor 456.

The fifth switch 830 is coupled between the first resistor 428 and the supply rail, and the sixth switch 835 is coupled between the second resistor 610 and the low rail (e.g., ground rail). In the enabled mode, the control circuit 650 closes (i.e., turns on) the fifth switch 830 and the sixth switch 835, as shown in FIG. 8A. In the disabled mode, the control circuit 650 opens (i.e., turns off) the fifth switch 830 and the sixth switch 835. This cuts leakage current paths through the first resistor 428 and the second resistor 610 in the disabled mode.

In some approaches, a pull-down switch is coupled between the output of the amplifier and the low rail (e.g., ground rail), in which the pull-down switch is closed (i.e., turned on) in the disabled mode to pull the output of the amplifier low in the disabled mode. However, the pull-down switch may create a leakage current path from the output to the low rail (e.g., ground rail) in the disabled mode, which increases the leakage current in the disabled mode. In the example in FIGS. 8A and 8B, the pull-down switch is replaced with a NAND gate 850 that effectively cuts the leakage path from the output 516 to the low rail.

The NAND gate 850 has a first input 852, a second input 854, and an output 856. The first input 852 of the NAND gate 850 is coupled to the output 516 of the hybrid amplifier 510, and the output 856 of the NAND gate 850 is coupled to the input of an inverter 860. In this example, the control circuit 650 selectively enables/disables the NAND gate 850 by controlling the logic state at the second input 854 of the NAND gate 850.

In the enabled mode, the control circuit 650 outputs a logic one to the second input 854 of the NAND gate 850, as shown in FIG. 8A. This causes the NAND gate 850 to function as an inverter coupled to the output 516 of the hybrid amplifier 510. In the enabled mode, the inverter 860 undoes the inversion of the NAND gate 850 such that the output of the inverter 860 has the same polarity as the output 516.

In the disabled mode, the control circuit 650 outputs a logic zero to the second input 854 of the NAND gate 850, as shown in FIG. 8B. This causes the NAND gate 850 to output a logic one at the output 856 of the NAND gate 850 in the disabled mode, which causes the inverter 860 to output a logic zero in the disabled mode.

In the enabled mode, the control circuit 650 may close or open the current-mirror switches 720 and 725 depending, for example, on whether the hybrid amplifier 510 is operating at the first data rate or the second data rate, as discussed above. In the disabled mode, the control circuit 650 opens the current-mirror switches 720 and 725 to cut current leakage paths through the current mirrors 430 and 440.

In this example, the first current mirror 430 further includes a first current-mirror switch 720 and a seventh current-mirror transistor 710 coupled in series between the output terminal 434 and the low rail. In this example, the control circuit 650 may set the first current-mirror factor to the first factor value by opening (i.e., turning off) the first current-mirror switch 720, and set the first current-mirror factor to the second factor value by closing (i.e., turning on) the first current-mirror switch 720. Turning on the first current-mirror switch 720 couples the seventh current-mirror transistor 710 to the output terminal 434.

Figure 8C:
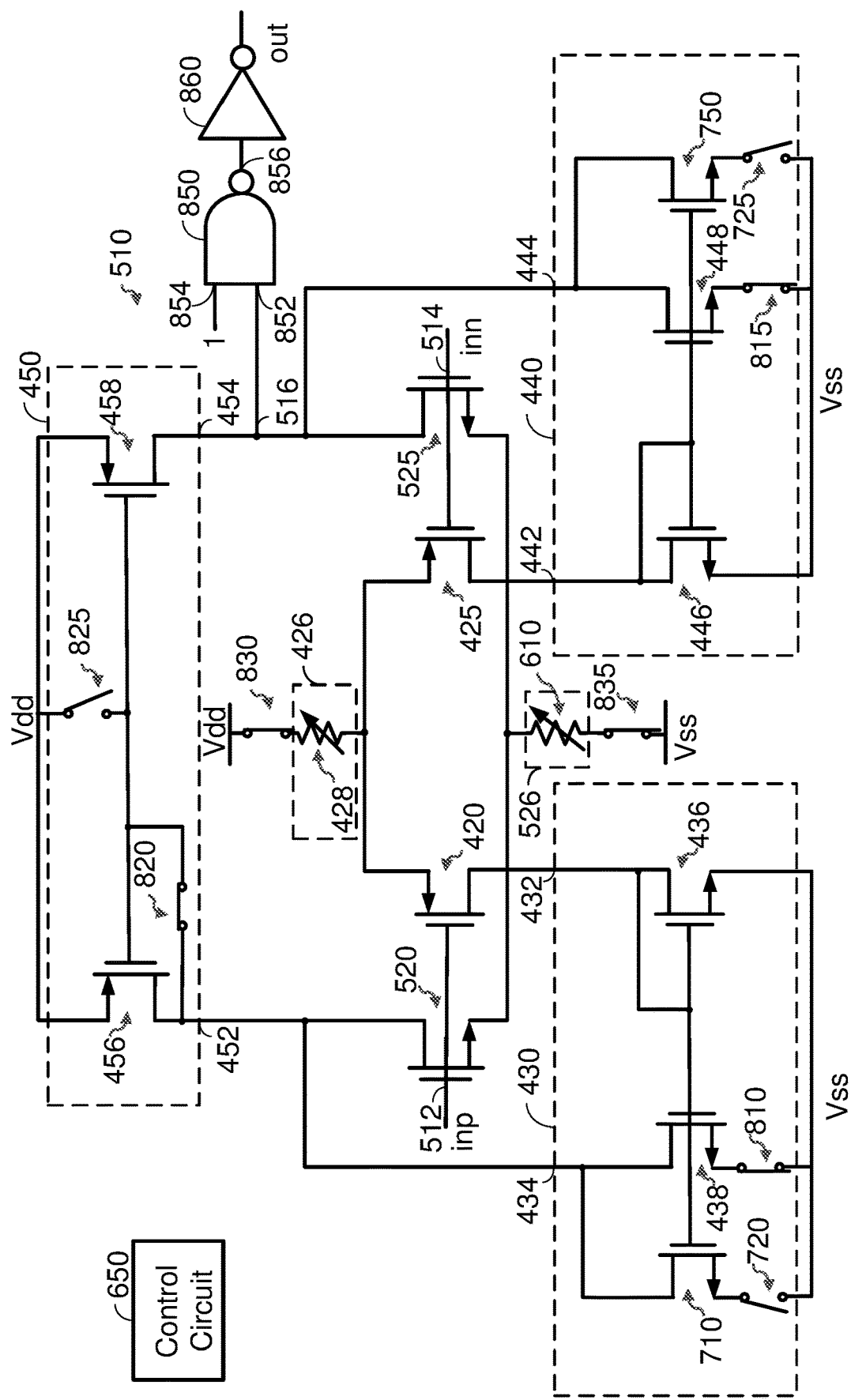
FIG. 8C shows another example of the hybrid amplifier with leakage-control switches in the first mode according to certain aspects of the present disclosure.
Figure 8D:
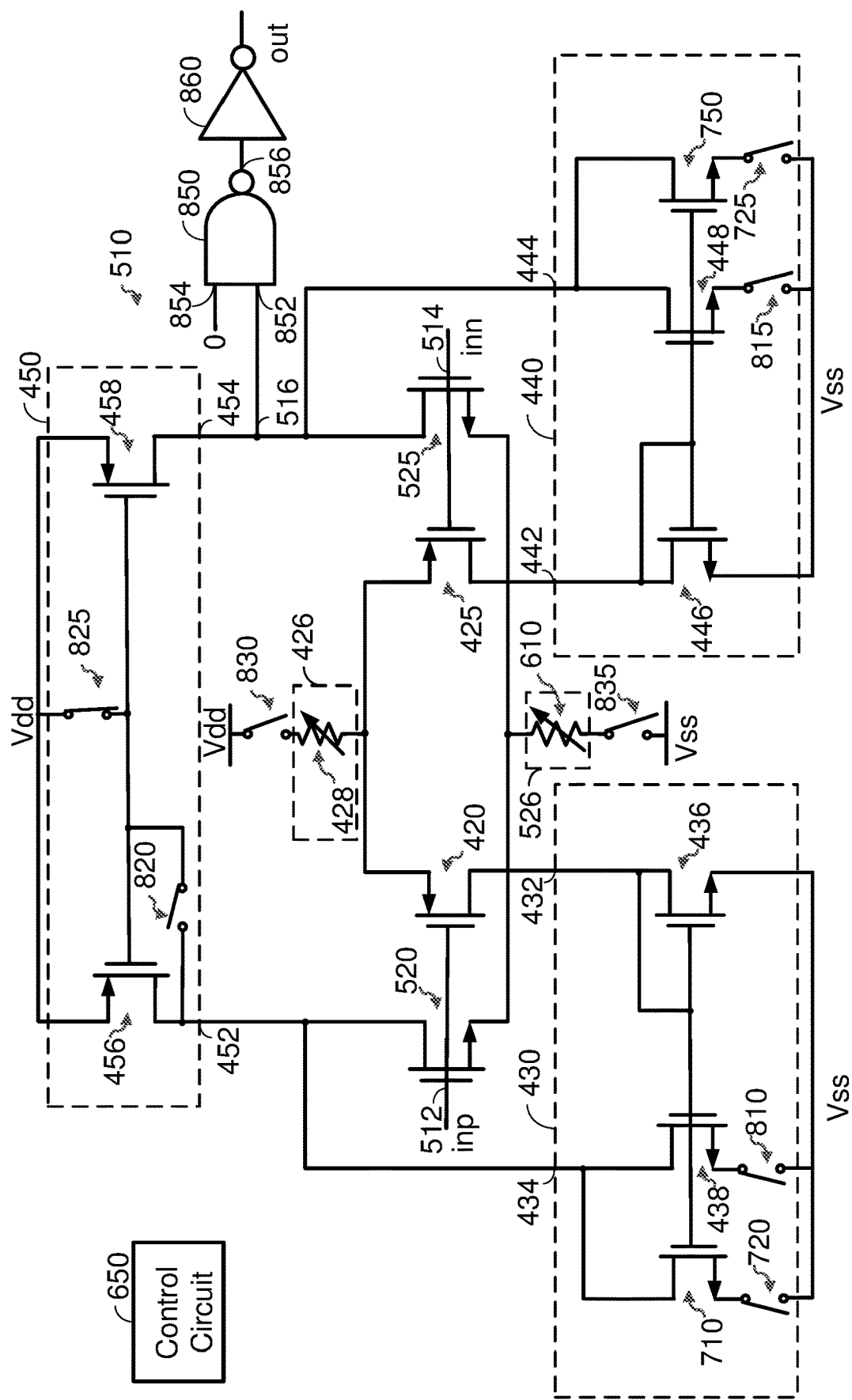
FIG. 8D shows another example of the hybrid amplifier with the leakage-control switches in the second mode according to certain aspects of the present disclosure.

It is to be appreciated that the present disclosure is not limited to the exemplary locations of the first switch 810 and the second switch 815 shown in FIGS. 8A and 8B. In this regard, FIGS. 8C and 8D show an example in which the first switch 810 is coupled between the second current-mirror transistor 438 and the low rail, and the second switch 815 is coupled between the fourth current-mirror transistor 448 and the low rail. In general, the first switch 810 and the second current-mirror transistor 438 may be coupled in series between the output terminal 434 and the low rail, and the second switch 815 and the fourth current-mirror transistor 448 may be coupled in series between the output terminal 444 and the low rail. FIG. 8C shows the on/off states of the switches 810 and 815 in the enabled mode, and FIG. 8D shows the on/off states of the switches 810 and 815 in the disabled mode.

FIGS. 8C and 8D also show an example in which the first current-mirror switch 720 is coupled between the seventh current-mirror transistor 710 and the low rail, and the second current-mirror switch 725 is between the eighth current-mirror transistor 750 and the low rail. In general, the first current-mirror switch 720 and the seventh current-mirror transistor 710 may be coupled in series between the output terminal 434 and the low rail, and the second current-mirror switch 725 and the eighth current-mirror transistor 750 may be coupled in series between the output terminal 444 and the low rail.

Figure 9:
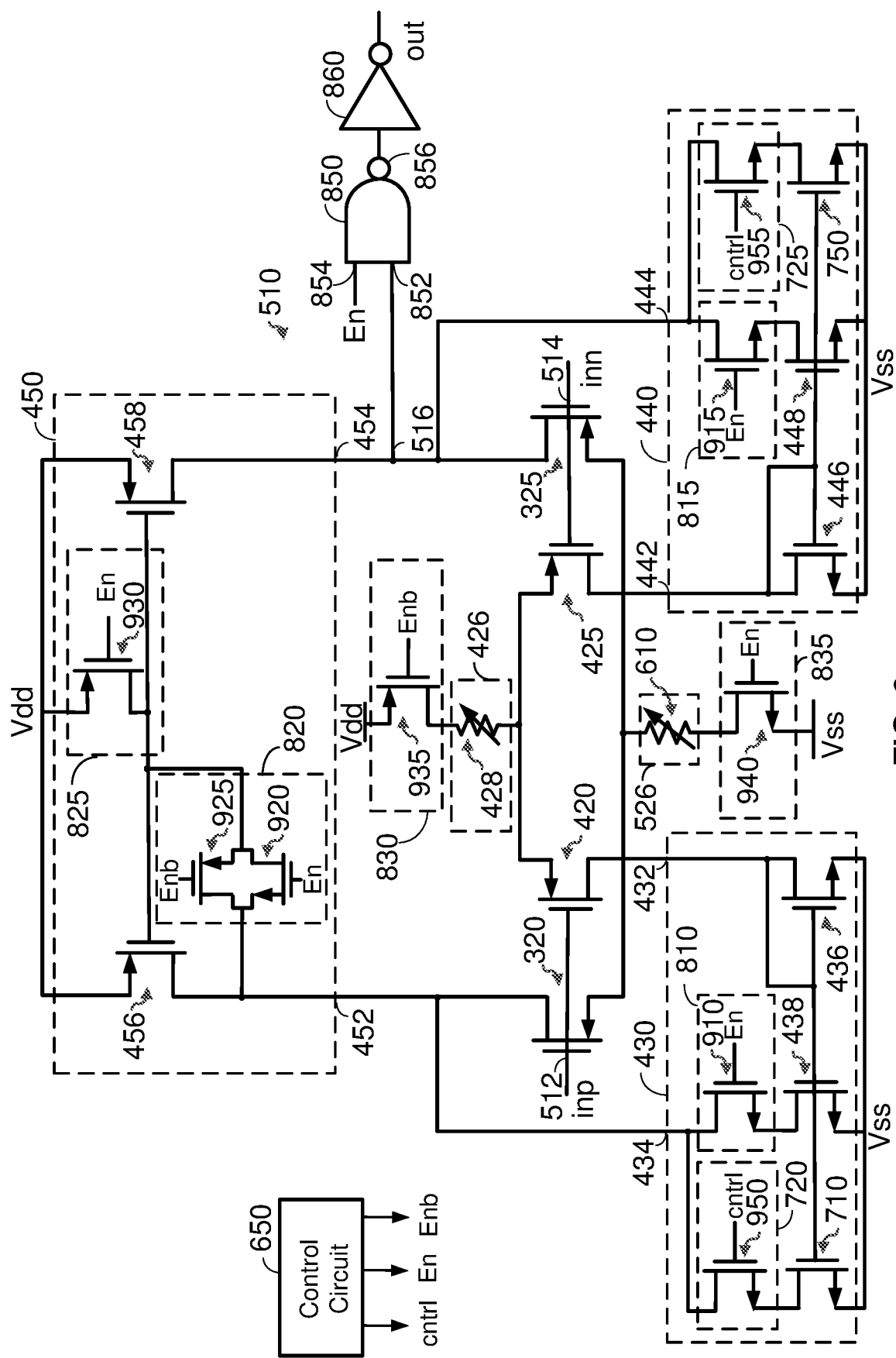
FIG. 9 shows an exemplary implementation of the leakage-control switches according to certain aspects of the present disclosure.

FIG. 9 shows an exemplary implementation of the first switch 810, the second switch 815, the third switch 820, the fourth switch 825, the fifth switch 830, and the sixth switch 835 according to certain aspects. In this example, the first switch 810 includes a first transistor 910 and the second switch 815 includes a second transistor 915. In the example shown in FIG. 9, which each of the first and second transistors 910 and 915 is an n-type transistor. In this example, the control circuit 650 inputs an enable signal ("En") to the gates of the first and second transistors 910 and 915 to control the on/off states of the first and second transistors 910 and 915. In the enabled mode, the enable signal is high (i.e., logic one) which causes the first and second transistors 910 and 915 to turn on in the enabled mode. In the disabled mode, the enable signal is low (i.e., logic zero) which causes the first and second transistors 910 and 915 to turn off in the disabled mode.

In the example in FIG. 9, the third switch 820 is implemented with a transmission gate including a third transistor 920 and a fourth transistor 925. In the example in FIG. 9, the third transistor 920 is an n-type transistor and the fourth transistor 925 is a p-type transistor. In this example, the control circuit 650 inputs the enable signal ("En") to the gate of the third transistor 920 and inputs the inverse of the enable signal ("Enb") to the gate of the fourth transistor 925. In the enabled mode, the enable signal is high (i.e., logic one) and the inverse of the enable signal is low (i.e., logic zero) which causes the third and fourth transistors 920 and 925 to turn on in the enabled mode. In the disabled mode, the enable signal is low (i.e., logic zero) and the inverse of the enabled signal is high (i.e., logic one) which causes the third and fourth transistors 920 and 925 to turn off in the disabled mode.

In the example in FIG. 9, the fourth switch 825 includes a fifth transistor 930 implemented with a p-type transistor. In this example, the control circuit 650 inputs the enable signal ("En") to the gate of the fifth transistor 930. In the enabled mode, the enable signal is high which turns off the fifth transistor 930 in the enabled mode. In the disabled mode, the enable signal is low which turns on the fifth transistor 930 in the disabled mode.

In the example in FIG. 9, the fifth switch 830 includes a sixth transistor 935 and the sixth switch 835 includes a seventh transistor 940. In this example, the sixth transistor 935 is a p-type transistor and the seventh transistor 940 is an n-type transistor. In this example, the control circuit 650 inputs the inverse of the enable signal ("Enb") to the gate of the sixth transistor 935 and inputs the enable signal ("En") to the gate of the seventh transistor 940. In the enabled mode, the enable signal is high (i.e., logic one) and the inverse of the enable signal is low (i.e., logic zero) which causes the sixth and seventh transistors 935 and 940 to turn on in the enabled mode. In the disabled mode, the enable signal is low (i.e., logic zero) and the inverse of the enabled signal is high (i.e., logic one) which causes the sixth and seventh transistors 935 and 940 to turn off in the disabled mode.

In the example in FIG. 9, the control circuit 650 inputs the enable signal ("En") to the second input 854 of the NAND gate 850. In the enabled mode, the enable signal is high which causes the NAND gate 850 to function as an inverter in the enabled mode. In the disabled mode, the enable signal is low which causes the NAND gate 850 to output a one at the output 856 of the NAND gate 850 in the disabled mode.

In the example in FIG. 9, the first current-mirror switch 720 includes an eighth transistor 950 and the second current-mirror switch 725 includes a ninth transistor 955. In this example, each of the eighth and ninth transistors 950 and 955 is a respective n-type transistor. The control circuit 650 may input a control signal ("cntrl") to the gates of the eighth and ninth transistors 950 and 955. To set the first current-mirror factor to the first factor value and the second current-mirror factor to the third factor value, the control circuit 650 sets the control signal low to turn off the current-mirror switches 720 and 725. As discussed above, the first factor value and the third factor value may be the same or different. To set the first current-mirror factor to the second factor value and the second current-mirror factor to the fourth factor value, the control circuit 620 sets the control signal high to turn on the current-mirror switches 720 and 725, which increases the first current-mirror factor and the second current-mirror factor. As discussed above, the second factor value and the fourth factor value may be the same or different. In the disabled mode, the control circuit 650 may set the control signal low to turn off the current-mirror switches 720 and 725 in the disabled mode.

Figure 10B:
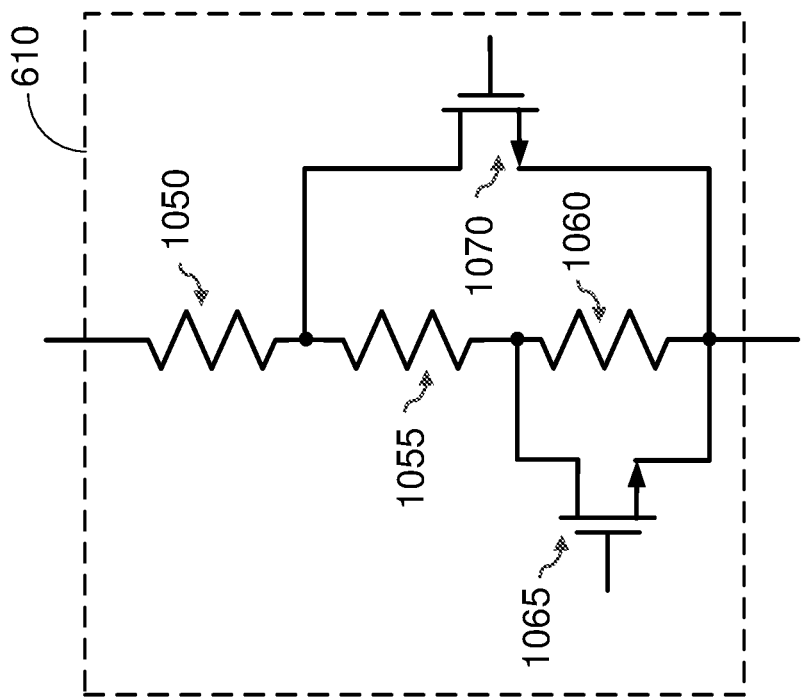
FIG. 10B shows an exemplary implementation of a second variable resistor according to certain aspects of the present disclosure.
Figure 10A:
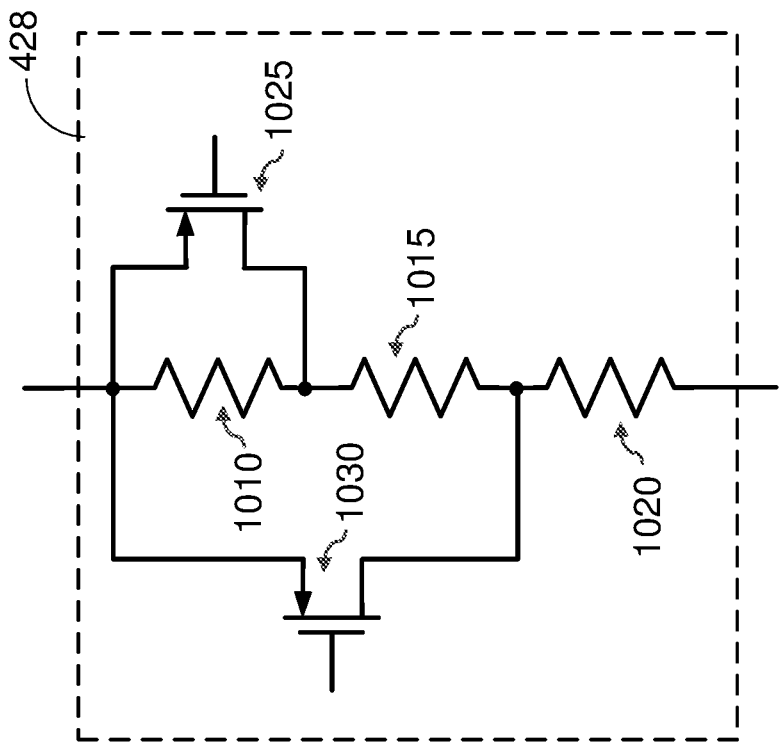
FIG. 10A shows an exemplary implementation of a first variable resistor according to certain aspects of the present disclosure.

FIG. 10A shows an exemplary implementation of the first resistor 428 according to certain aspects. In this example, the first resistor 428 includes resistors 1010, 1015, and 1020 coupled in series, a first transistor 1025, and a second transistor 1030. In this example, each of the first and second transistors 1025 and 1030 is implemented with a respective p-type transistor. However, it is to be appreciated that the present disclosure is not limited to this example.

The resistor 1010 is coupled between the source and the drain of the first transistor 1025, and the resistors 1010 and 1015 are coupled in series between the drain and the source of the second transistor 1030. In this example, the control circuit 650 may adjust (i.e., program) the resistance of the first resistor 428 by controlling the on/off states of the first and second transistors 1025 and 1030. For example, when the control circuit 650 turns off the first and second transistors 1025 and 1030, the resistance of the first resistor 428 is approximately equal to the sum of the resistances of the resistors 1010, 1015, and 1020. When the control circuit 650 turns on the first transistor 1025 and turns off the second transistor 1030, the resistance of the first resistor 428 is approximately equal to the sum of the resistances of the resistors 1015 and 1020. When the control circuit 650 turns on the second transistor 1030, the resistance of the first resistor 428 is approximately equal to the resistance of resistor 1020.

FIG. 10B shows an exemplary implementation of the second resistor 610 according to certain aspects. In this example, the second resistor 610 includes resistors 1050, 1055, and 1060 coupled in series, a first transistor 1065, and a second transistor 1070. In this example, each of the first and second transistors 1065 and 1070 is implemented with a respective n-type transistor. However, it is to be appreciated that the present disclosure is not limited to this example.

The resistor 1060 is coupled between the drain and the source of the first transistor 1065, and the resistors 1060 and 1055 are coupled in series between the drain and the source of the second transistor 1070. In this example, the control circuit 650 may adjust (i.e., program) the resistance of the second resistor 610 by controlling the on/off states of the first and second transistors 1065 and 1070. For example, when the control circuit 650 turns off the first and second transistors 1065 and 1070, the resistance of the second resistor 610 is approximately equal to the sum of the resistances of the resistors 1050, 1055, and 1060. When the control circuit 650 turns on the first transistor 1065 and turns off the second transistor 1070, the resistance of the second resistor 610 is approximately equal to the sum of the resistances of the resistors 1050 and 1055. When the control circuit 650 turns on the second transistor 1070, the resistance of the second resistor 610 is approximately equal to the resistance of resistor 1050.

It is to be appreciated that the first resistor 428 and the second resistor 610 are not limited to the examples shown in FIGS. 10A and 10B, and the first resistor 428 and the second resistor 610 may be implemented with various types of variable resistors.

Figure 11:
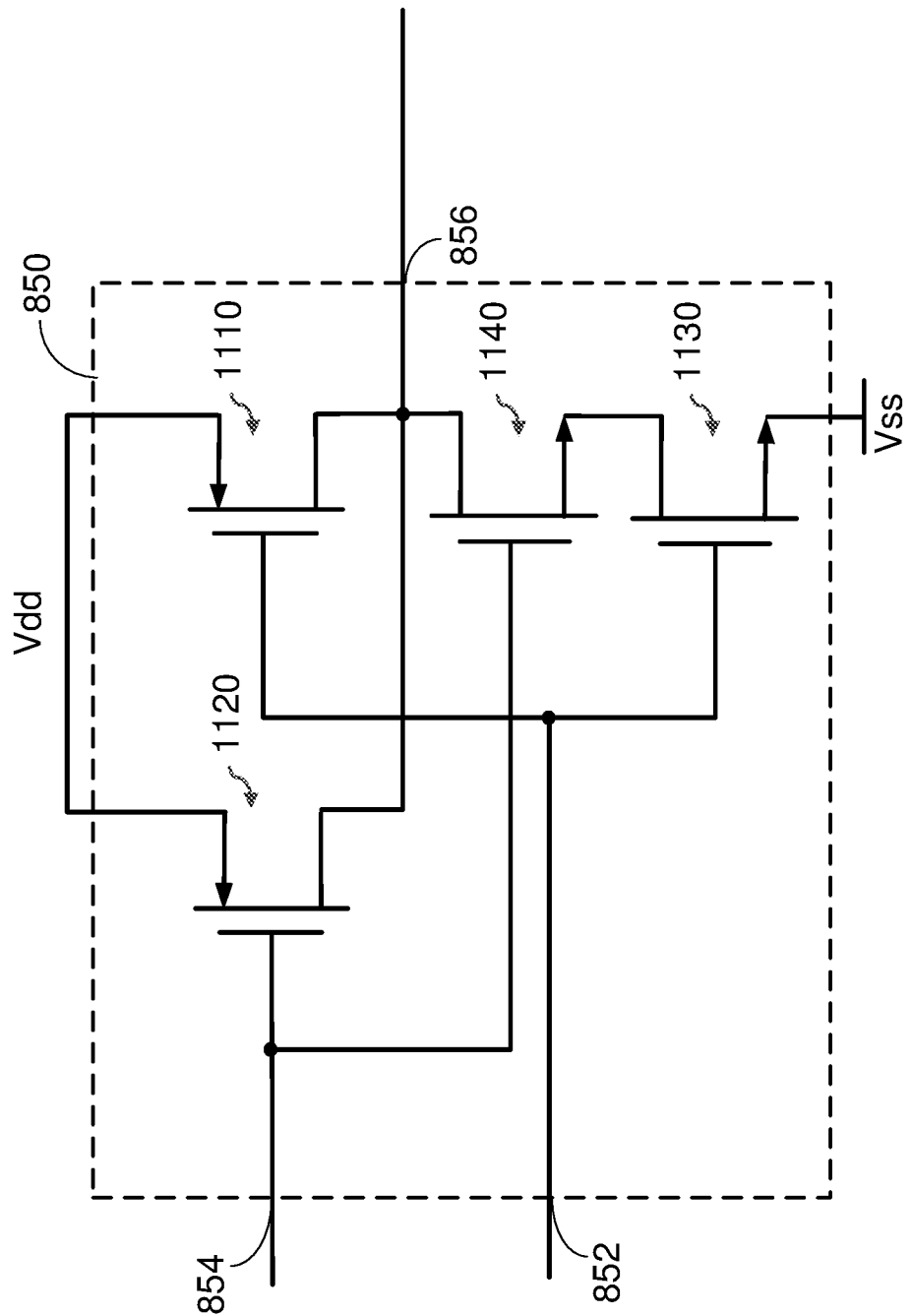
FIG. 11 shows an exemplary implementation of a NAND gate according to certain aspects of the present disclosure.

FIG. 11 shows an exemplary implementation of the NAND gate 850 according to certain aspects. In this example, the NAND gate 850 includes a first p-type transistor 1110 and a second p-type transistor 1120 coupled in parallel between the supply rail and the output 856. The NAND gate 850 also includes a first n-type transistor 1130 and a second n-type transistor 1140 coupled in series between the output 856 and the low rail (e.g., ground rail). In this example, the first input 852 is coupled to the gate of the first p-type transistor 1110 and the gate of the first n-type transistor 1130, and the second input 854 is coupled to the gate of the second p-type transistor 1120 and the gate of the second n-type transistor 1140.

In the examples shown in FIGS. 8A, 8B, and 9, the first input 852 is coupled to the output 516 of the hybrid amplifier 510. In the example in FIG. 11, the first input 852 is coupled to the gates of the first p-type transistor 1110 and the first n-type transistor 1130, which helps prevent leakage current from the output 516 of the hybrid amplifier 510 to the low rail through the NAND gate 850.

Figure 12:
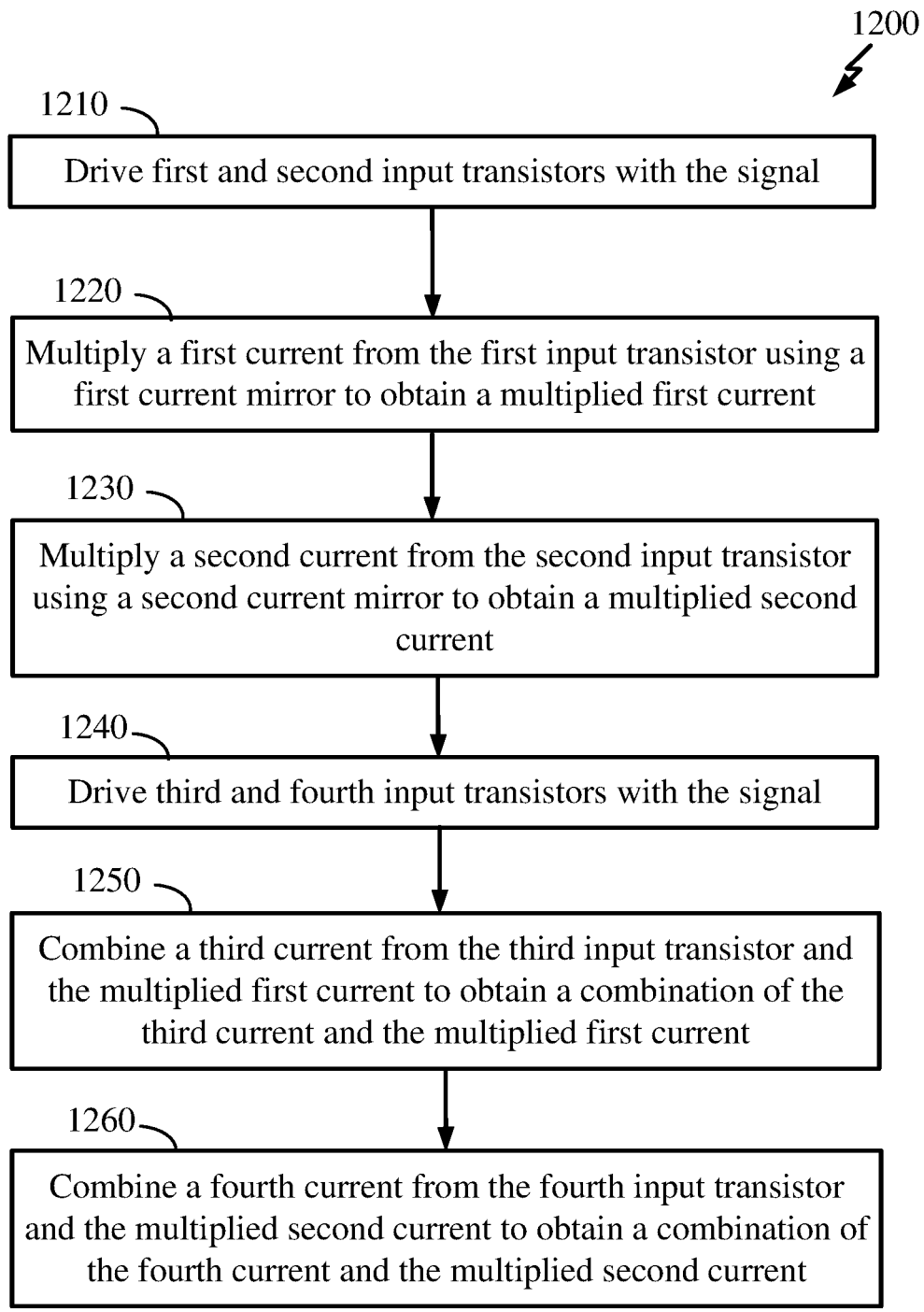
FIG. 12 is a flowchart illustrating a method for amplifying a signal according to certain aspects of the present disclosure.

FIG. 12 illustrates a method 1200 for amplifying a signal. The signal may be a differential signal, a pseudo-differential signal, or another type of signal. The method 1200 may be performed by the hybrid amplifier 510.

At block 1210, first and second input transistors are driven with the signal. For example, the first input transistor may correspond to the first input transistor 420 and the second input transistor may correspond to the second input transistor 425. For the example where the signal is a differential signal including a first signal and a second signal, the first signal may be input to the gate of the first input transistor and the second signal may be input to the gate of the second input transistor.

At block 1220, a first current from the first input transistor is multiplied using a first current mirror to obtain a multiplied first current. For example, the first current mirror may correspond to the first current mirror 430. In this example, the first current mirror may multiply the first current by the current-mirror factor of the first current mirror.

At block 1230, a second current from the second input transistor is multiplied using a second current mirror to obtain a multiplied second current. For example, the second current mirror may correspond to the second current mirror 440. In this example, the second current mirror may multiply the second current by the current-mirror factor of the second current mirror.

At block 1240, third and fourth input transistors are driven with the signal. For example, the third input transistor may correspond to the third input transistor 520 and the fourth input transistor may correspond to the fourth input transistor 525. For the example where the signal is the differential signal including the first signal and the second signal, the first signal may be input to the gate of the third input transistor and the second signal may be input to the gate of the fourth input transistor. In certain aspects, the third and fourth input transistors may be of a different transistor type than the first and second input transistors. For example, the first and second input transistors may be p-type transistors and the third and fourth input transistors may be n-type transistors, or vice versa.

At block 1250, a third current from the third input transistor and the multiplied first current are combined to obtain a combination of the third current and the multiplied first current. For example, the third current and the multiplied first current may be combined at a node coupled to an output terminal (e.g., output terminal 434) of the first current mirror and the drain of the third input transistor.

At block 1260, a fourth current from the fourth input transistor and the multiplied second current are combined to obtain a combination of the fourth current and the multiplied second current. For example, the fourth current and the multiplied second current may be combined a node coupled to an output terminal (e.g., output terminal 444) of the second current mirror and the drain of the fourth input transistor.

The method 1200 may also include directing the combination of the third current and the multiplied first current to an output using a third current mirror. For example, the output may correspond to the output 516, and the third current mirror may correspond to the third current mirror 450. For example, the third current mirror may direct the combination of the third current and the multiplied first current to the output (e.g., output 516) by mirroring the combination of the third current and the multiplied first current at an output terminal (e.g., output terminal 454) of the third current mirror that is coupled to the output (output 516). The method may also include providing the combination of the fourth current and the multiplied second current to the output. For example, the output may be coupled to the node where the fourth current and the multiplied second current are combined.

It is to be appreciated that any one or more of the transistors discussed above may be physically implemented on a chip using multiple transistors integrated on the chip. For example, a transistor may be implemented with multiple transistors in which the channels of the multiple transistors are coupled in series and/or parallel, and the gates of the multiple transistors are coupled together.

Implementation examples are described in the following numbered clauses:

1. A system, comprising:
    an amplifier, wherein the amplifier comprises:
        a first input transistor, wherein a gate of the first input transistor is coupled to a first input of the amplifier;
        a second input transistor, wherein a gate of the second input transistor is coupled to a second input of the amplifier;
        a first current mirror, wherein an input terminal of the first current mirror is coupled to a drain of the first input transistor;
        a second current mirror, wherein an input terminal of the second current mirror is coupled to a drain of the second input transistor, and an output terminal of the second current mirror is coupled to an output of the amplifier;
        a third current mirror, wherein an input terminal of the third current mirror is coupled to an output terminal of the first current mirror, and an output terminal of the third current mirror is coupled to the output of the amplifier;
        a third input transistor, wherein a gate of the third input transistor is coupled to the first input of the amplifier, and a drain of the third input transistor is coupled to the input terminal of the third current mirror; and
        a fourth input transistor, wherein a gate of the fourth input transistor is coupled to a second input of the amplifier, and a drain of the fourth input transistor is coupled to the output of the amplifier.

2. The system of clause 1, wherein:
    the first input transistor comprises a first p-type transistor;
    the second input transistor comprises a second p-type transistor;
    the third input transistor comprises a first n-type transistor; and
    the fourth input transistor comprises a second n-type transistor.

3. The system of clause 1 or 2, wherein the amplifier further comprises a first resistor, wherein the first resistor is coupled between a first rail and a source of the first input transistor, and the first resistor is coupled between the first rail and a source of the second input transistor.

4. The system of clause 3, wherein the first resistor comprises a variable resistor.

5. The system of clause 4, further comprising a control circuit wherein the control circuit is configured to:
    set a resistance of the first resistor to a first resistance value for a first data rate; and
    set the resistance of the first resistor to a second resistance value for a second data rate, wherein the second data rate is higher than the first data rate, and the second resistance value is lower than the first resistance value.

6. The system of any one of clauses 3 to 5, wherein the amplifier further comprises a second resistor, wherein the second resistor is coupled between a source of the third input transistor and a second rail, and the second resistor is coupled between a source of the fourth input transistor and the second rail.

7. The system of clause 6, wherein the second rail has a lower potential than the first rail.

8. The system of clause 6 or 7, wherein:
    the first resistor comprises a first variable resistor; and
    the second resistor comprises a second variable resistor.

9. The system of any one of clauses 1 to 8, wherein the first current mirror comprises:
    a first current-mirror transistor, wherein a drain of the first current-mirror transistor is coupled to the input terminal of the first current mirror, a gate of the first current-mirror transistor is coupled to the drain of the first current-mirror transistor, and a source of the first current-mirror transistor is coupled to a rail;
    a second current-mirror transistor, wherein a gate of the second current-mirror transistor is coupled to the gate of the first current-mirror transistor; and
    a first switch coupled in series with the second current-mirror transistor between the output terminal of the first current mirror and the rail.

10. The system of clause 9, further comprising a control circuit configured to:
    close the first switch in an enabled mode; and
    open the first switch in a disabled mode.

11. The system of clause 9, wherein the first current mirror further comprises:
    a third current-mirror transistor, wherein a gate of the third current-mirror transistor is coupled to the gate of the first current-mirror transistor; and
    a second switch coupled in series with the third current-mirror transistor between the output terminal of the first current mirror and the rail.

12. The system of clause 11, further comprising a control circuit configured to:
close the first switch in an enabled mode;
open the first switch and the second switch in a disabled mode; and
in the enabled mode:
open the second switch for a first data rate; and
close the second switch for a second data rate, wherein the second data rate is higher than the first data rate.

13. The system of any one of clauses 1 to 8, wherein the third current mirror comprises:
a first current-mirror transistor, wherein a drain of the first current-mirror transistor is coupled to the input terminal of the third current mirror, and a source of the first current-mirror transistor is coupled to a rail;
a second current-mirror transistor, wherein a gate of the second current-mirror transistor is coupled to a gate of the first current-mirror transistor, a drain of the second current-mirror transistor is coupled to the output terminal of the third current mirror, and a source of the second current-mirror transistor is coupled to the rail; and
a switch coupled between the gate of the first current-mirror transistor and the drain of the first current-mirror transistor.

14. The system of clause 13, further comprising a control circuit configured to:
close the switch in an enabled mode; and
open the switch in a disabled mode.

15. The system of any one of clauses 1 to 14, further comprising a NAND gate having a first input, a second input, and an output, wherein the first input of the NAND gate is coupled to the output of the amplifier.

16. The system of clause 15, further comprising a control circuit configured to output a logic one to the second input of the NAND gate in an enabled mode, and output a logic zero to the second input of the NAND gate in a disabled mode.

17. A method for amplifying a signal, comprising:
driving first and second input transistors with the signal;
multiplying a first current from the first input transistor using a first current mirror to obtain a multiplied first current;
multiplying a second current from the second input transistor using a second current mirror to obtain a multiplied second current;
driving third and fourth input transistors with the signal;
combining a third current from the third input transistor and the multiplied first current to obtain a combination of the third current and the multiplied first current; and
combining a fourth current from the fourth input transistor and the multiplied second current to obtain a combination of the fourth current and the multiplied second current.

18. The method of clause 17, further comprising:
directing the combination of the third current and the multiplied first current to an output using a third current mirror; and
providing the combination of the fourth current and the multiplied second current to the output.

19. The method of clause 17 or 18, wherein:
the first input transistor comprises a first p-type transistor;
the second input transistor comprises a second p-type transistor;
the third input transistor comprises a first n-type transistor; and
the fourth input transistor comprises a second n-type transistor.

20. The method of any one of clauses 17 to 19, wherein the signal is a differential signal or a pseudo-differential signal.

21. The method of any one of clauses 17 to 20, wherein multiplying the first current from the first input transistor using the first current mirror comprises multiplying the first current by a current-mirror factor of the first current mirror.

22. The method of clause 21, further comprising:
setting the current-mirror factor to a first factor value for a first data rate; and
setting the current-mirror factor to a second factor value for a second data rate, wherein the second data rate is higher than the first data rate, and the second factor value is greater than the first factor value.

It is to be appreciated that the present disclosure is limited to the exemplary terminology used above to describe aspects of the present disclosure. For example, a pad may also be referred to as a pin, an input/output (I/O) pad, or another term. In another example, a link may also be referred to as a channel, a transmission line, an interconnect, a bus, or another term. In another example, a p-type transistor may also be referred to as a p-channel transistor, and an n-type transistor may also be referred to as an n-channel transistor.

The control circuit 650 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
an amplifier, wherein the amplifier comprises:
a first input transistor, wherein a gate of the first input transistor is coupled to a first input of the amplifier;
a second input transistor, wherein a gate of the second input transistor is coupled to a second input of the amplifier;
a first current mirror, wherein an input terminal of the first current mirror is coupled to a drain of the first input transistor;
a second current mirror, wherein an input terminal of the second current mirror is coupled to a drain of the second input transistor, and an output terminal of the second current mirror is coupled to an output of the amplifier;
a third current mirror, wherein an input terminal of the third current mirror is coupled to an output terminal of the first current mirror, an output terminal of the third current mirror is coupled to the output of the amplifier, and the third current mirror comprises:
a first current-mirror transistor, wherein a drain of the first current-mirror transistor is coupled to the input terminal of the third current mirror, and a source of the first current-mirror transistor is coupled to a first rail;
a second current-mirror transistor, wherein a gate of the second current-mirror transistor is coupled to a gate of the first current-mirror transistor, a drain of the second current-mirror transistor is coupled to the output terminal of the third current mirror, and a source of the second current-mirror transistor is coupled to the first rail;
a first switch coupled between the gate of the first current-mirror transistor and the drain of the first current-mirror transistor; and
a second switch coupled between the gate of the first current-mirror transistor and the first rail;
a third input transistor, wherein a gate of the third input transistor is coupled to the first input of the amplifier, and a drain of the third input transistor is coupled to the input terminal of the third current mirror;
a fourth input transistor, wherein a gate of the fourth input transistor is coupled to the second input of the amplifier, and a drain of the fourth input transistor is coupled to the output of the amplifier; and
a control circuit configured to:
close the first switch and open the second switch in an enabled mode; and
open the first switch and close the second switch in a disabled mode.

2. The system of claim 1, wherein:
the first input transistor comprises a first p-type transistor;
the second input transistor comprises a second p-type transistor;
the third input transistor comprises a first n-type transistor; and
the fourth input transistor comprises a second n-type transistor.

3. The system of claim 1, wherein the amplifier further comprises:
a first resistor, wherein the first resistor is coupled between the first rail and a source of the first input transistor, and the first resistor is coupled between the first rail and a source of the second input transistor; and
a second resistor, wherein the second resistor is coupled between a source of the third input transistor and a second rail, and the second resistor is coupled between a source of the fourth input transistor and the second rail.

4. The system of claim 3, wherein the second rail has a lower potential than the first rail.

5. The system of claim 3, wherein the first resistor comprises a first variable resistor and the second resistor comprises a second variable resistor.

6. The system of claim 1, wherein
the first current mirror comprises:
a third current-mirror transistor, wherein a drain of the third current-mirror transistor is coupled to the input terminal of the first current mirror, a gate of the third current-mirror transistor is coupled to the drain of the third current-mirror transistor, and a source of the third current-mirror transistor is coupled to a second rail;
a fourth current-mirror transistor, wherein a gate of the fourth current-mirror transistor is coupled to the gate of the third current-mirror transistor; and
a third switch coupled in series with the fourth current-mirror transistor between the output terminal of the first current mirror and the second rail, wherein the control circuit is configured to close the third switch in the enabled mode and open the third switch in the disabled mode.

7. The system of claim 1, further comprising a NAND gate having a first input, a second input, and an output, wherein the first input of the NAND gate is coupled to the output of the amplifier.

8. The system of claim 7, wherein the control circuit is configured to output a logic one to the second input of the NAND gate in the enabled mode, and output a logic zero to the second input of the NAND gate in the disabled mode.

9. A method for amplifying a signal, comprising:
driving first and second input transistors with the signal;
multiplying a first current from the first input transistor using a first current mirror to obtain a multiplied first current;
multiplying a second current from the second input transistor using a second current mirror to obtain a multiplied second current;
driving third and fourth input transistors with the signal;
combining a third current from the third input transistor and the multiplied first current to obtain a combination of the third current and the multiplied first current;
combining a fourth current from the fourth input transistor and the multiplied second current to obtain a combination of the fourth current and the multiplied second current;
directing the combination of the third current and the multiplied first current to an output using a third current mirror, wherein the third current mirror comprises a first current-mirror transistor and a second current-mirror transistor, and a gate of the first current-mirror transistor is coupled to a gate of the second current-mirror transistor;
providing the combination of the fourth current and the multiplied second current to the output;
in an enabled mode, closing a first switch and opening a second switch, wherein the first switch is coupled between a drain of the first current-mirror transistor and the gate of the first current-mirror transistor, and the second switch is coupled between the gate of the first current-mirror transistor and a rail; and
in a disabled mode, opening the first switch and closing the second switch.

10. The method of claim 9, wherein:

the first input transistor comprises a first p-type transistor;

the second input transistor comprises a second p-type transistor;

the third input transistor comprises a first n-type transistor; and the fourth input transistor comprises a second n-type transistor.

11. The method of claim 9, wherein the signal is a differential signal or a pseudo-differential signal.

12. The system of claim 1, wherein the first current-mirror transistor comprises a first p-type transistor, and the second current-mirror transistor comprises a second p-type transistor.

13. The system of claim 6, wherein:

the first current-mirror transistor comprises a first p-type transistor;

the second current-mirror transistor comprises a second p-type transistor;

the third current-mirror transistor comprises a first n-type transistor; and the fourth current-mirror transistor comprises a second n-type transistor.

14. The system of claim 13, wherein the second rail has a lower potential than the first rail.

15. The system of claim 6, wherein the third switch is coupled between a drain of the fourth current-mirror transistor and the output terminal of the first current mirror.

\* \* \* \* \*